US011581241B2

(12) United States Patent
Low et al.

(10) Patent No.: US 11,581,241 B2
(45) Date of Patent: Feb. 14, 2023

(54) CIRCUIT MODULES WITH FRONT-SIDE INTERPOSER TERMINALS AND THROUGH-MODULE THERMAL DISSIPATION STRUCTURES

(71) Applicant: NXP USA, Inc., Austin, TX (US)

(72) Inventors: Boon Yew Low, Subang Jaya (MY); Fernando A. Santos, Chandler, AZ (US); Li Li, Scottsdale, AZ (US); Fui Yee Lim, Kuala Lumpur (MY); Lan Chu Tan, Singapore (SG)

(73) Assignee: NXP USA, Inc., Austin, TX (US)

( * ) Notice: Subject to any disclaimer, the term of this patent is extended or adjusted under 35 U.S.C. 154(b) by 0 days.

(21) Appl. No.: 17/136,408

(22) Filed: Dec. 29, 2020

(65) Prior Publication Data
US 2022/0208646 A1 Jun. 30, 2022

(51) Int. Cl.
*H01L 23/42* (2006.01)
*H01L 21/48* (2006.01)
*H01L 23/482* (2006.01)

(52) U.S. Cl.
CPC .......... *H01L 23/42* (2013.01); *H01L 21/4871* (2013.01); *H01L 23/4824* (2013.01)

(58) Field of Classification Search
CPC ................. H01L 23/42; H01L 23/4824; H01L 21/4871

(Continued)

(56) References Cited

U.S. PATENT DOCUMENTS

| 6,580,611 | B1 * | 6/2003 | Vandentop ............ H01L 23/367 257/713 |
| 7,755,186 | B2 | 7/2010 | Chiu et al. |
| 9,899,292 | B2 | 2/2018 | Chiu et al. |
| 9,986,646 | B2 | 5/2018 | Viswanathan et al. |

(Continued)

FOREIGN PATENT DOCUMENTS

EP 3337037 A1 6/2018

OTHER PUBLICATIONS

Yuen, Cindy et al; "A compact Flip Chip High Power Amplifier Module for Mobile Applications"; Proceedings of Asia-Pacific Microwave Conference 2010; 4 pages (2010).

(Continued)

*Primary Examiner* — Quoc D Hoang
(74) *Attorney, Agent, or Firm* — Sherry Gourlay

(57) ABSTRACT

A circuit module (e.g., an amplifier module) includes a module substrate, a thermal dissipation structure, a semiconductor die, encapsulant material, and an interposer. The module substrate has a mounting surface and a plurality of conductive pads at the mounting surface. The thermal dissipation structure extends through the module substrate, and a surface of the thermal dissipation structure is exposed at the mounting surface of the module substrate. The semiconductor die is coupled to the surface of the thermal dissipation structure. The encapsulant material covers the mounting surface of the module substrate and the semiconductor die, and a surface of the encapsulant material defines a contact surface of the circuit module. The interposer is embedded within the encapsulant material. The interposer includes a conductive terminal with a proximal end coupled to a conductive pad of the module substrate, and a distal end exposed at the contact surface of the circuit module.

19 Claims, 15 Drawing Sheets

(58) Field of Classification Search
USPC .......................................................... 257/712
See application file for complete search history.

(56) References Cited

U.S. PATENT DOCUMENTS

| 2013/0277855 A1* | 10/2013 | Kang ................ H01L 23/49827 |
| | | 257/774 |
| 2016/0150632 A1 | 5/2016 | Viswanathan et al. |
| 2019/0080973 A1 | 3/2019 | Otremba et al. |
| 2019/0343005 A1 | 11/2019 | Santos et al. |

OTHER PUBLICATIONS

Galkina, Nina; "60pcs TSSOP8 SSOP8 SOP8 To DIP8 Interposer Module PCB Board Adapter Plate"; downloaded from https://ninagalkina.blogspot.com/2019/08/60pcs-tssop8-ssop8-sop8-todip8.html on Nov. 16, 2020; 13 pages (Aug. 27, 2019).

Soga, Ikuo et al; "Thermal Management for Flip-chip High Power Amplifiers utilizing Carbon Nanotube Bumps"; IEEE Int'l Symposium on Radio-Frequency Integration Technology, Singapore, Singapore; 4 pages (Jan. 2009) (Aug. 27, 2019).

Meyer, Thorsten et al.; "Automotive packaging trends: challenges and solutions"; Chip Scale Review; retreived from the Internet https://www.chipscalereview.com/blog/Automotive-packaging-trends:-challenges-and-solutions on Nov. 5, 2020; 14 pages.

U.S. Appl. No. 16/851,895; not yet published; 48 pages (Apr. 17, 2020).

U.S. Appl. No. 16/852,064; not yet published; 40 pages (Apr. 17, 2020).

U.S. Appl. No. 17/077,583; not yet published; 48 pages (Oct. 22, 2020).

* cited by examiner

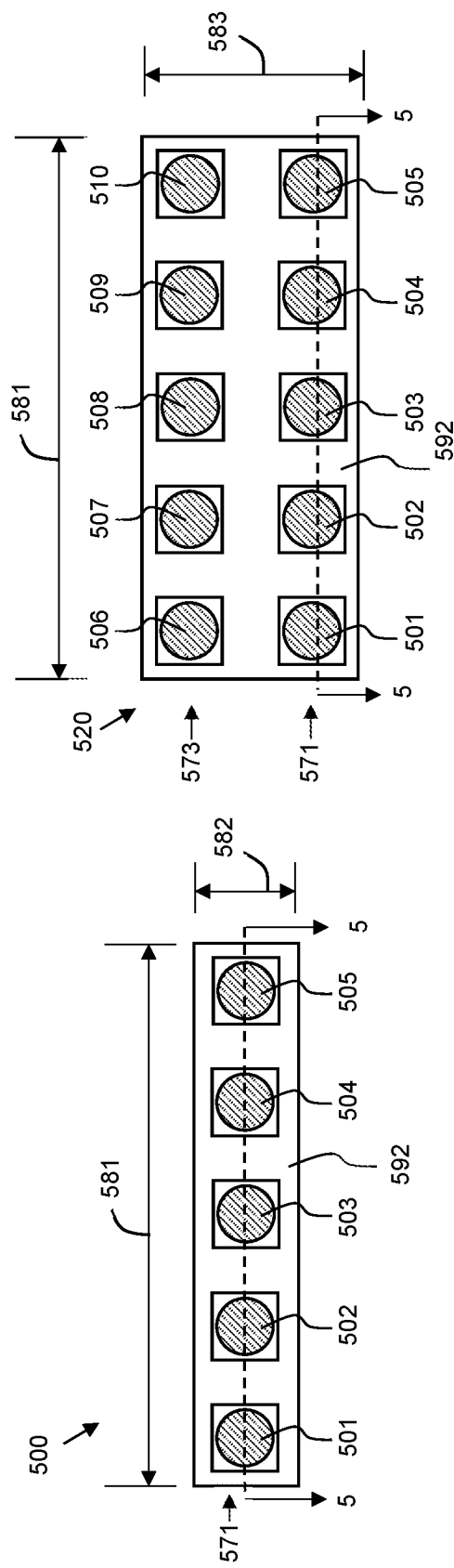
FIG. 5A
FIG. 5B
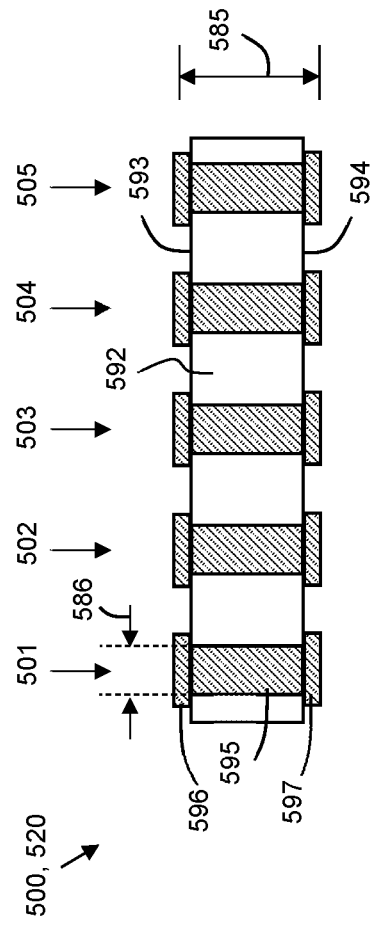
FIG. 5C

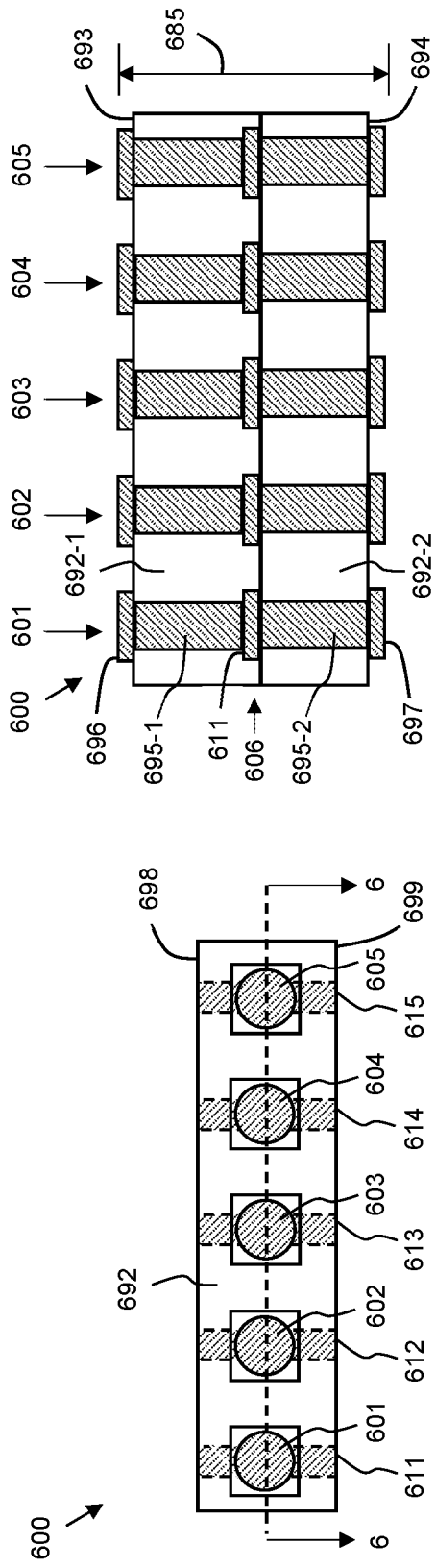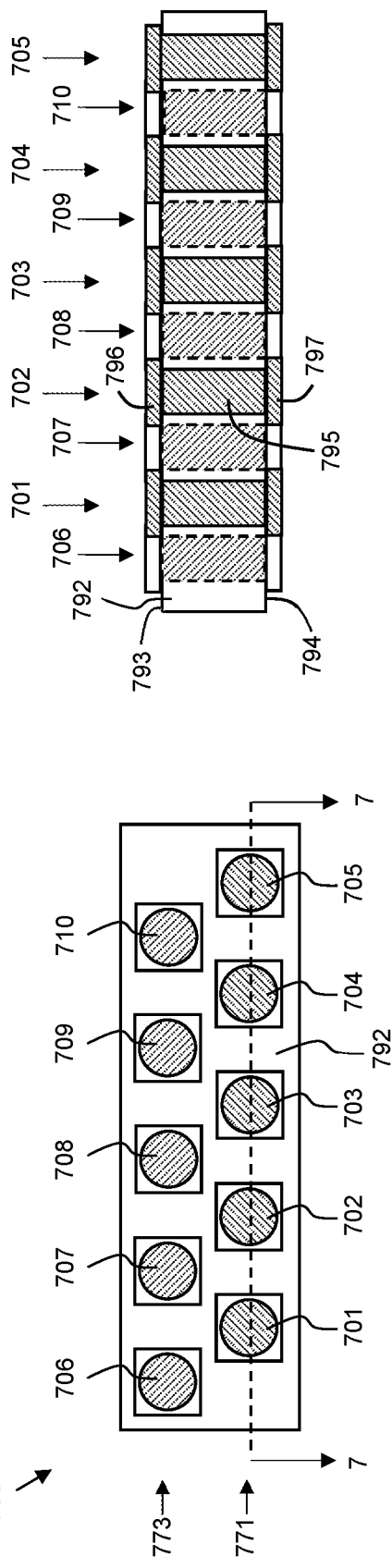

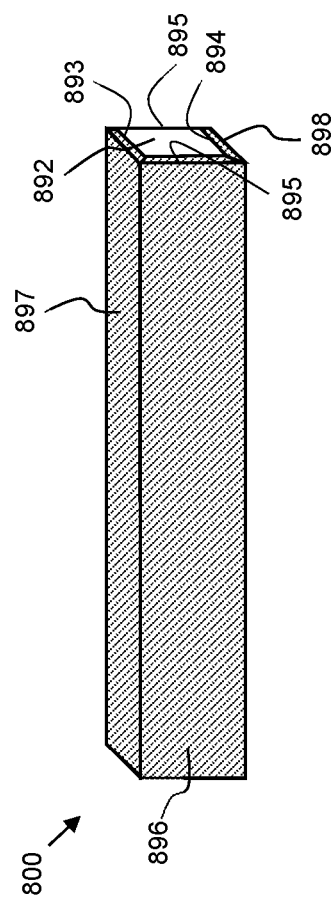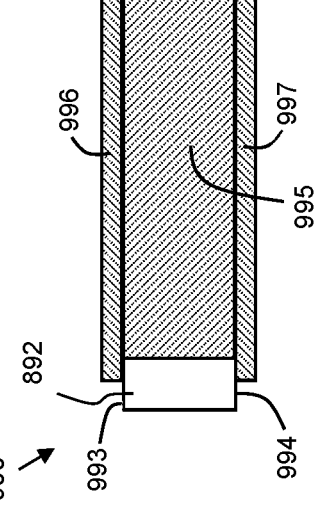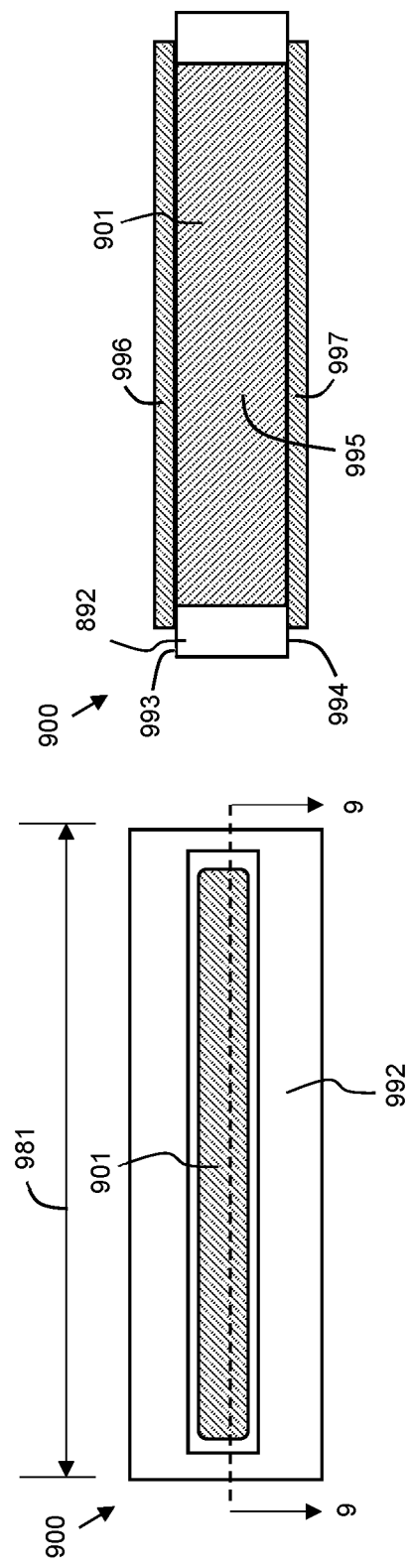
FIG. 8
FIG. 9A
FIG. 9B

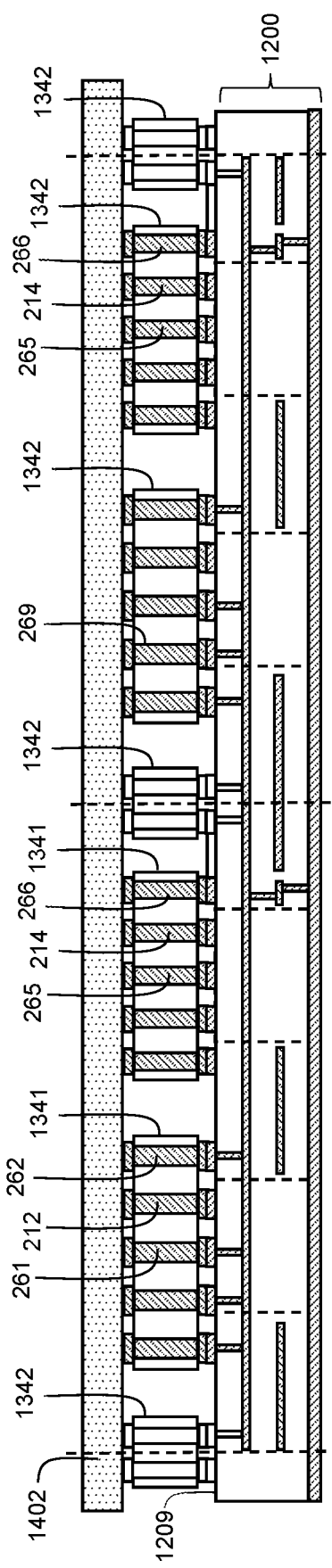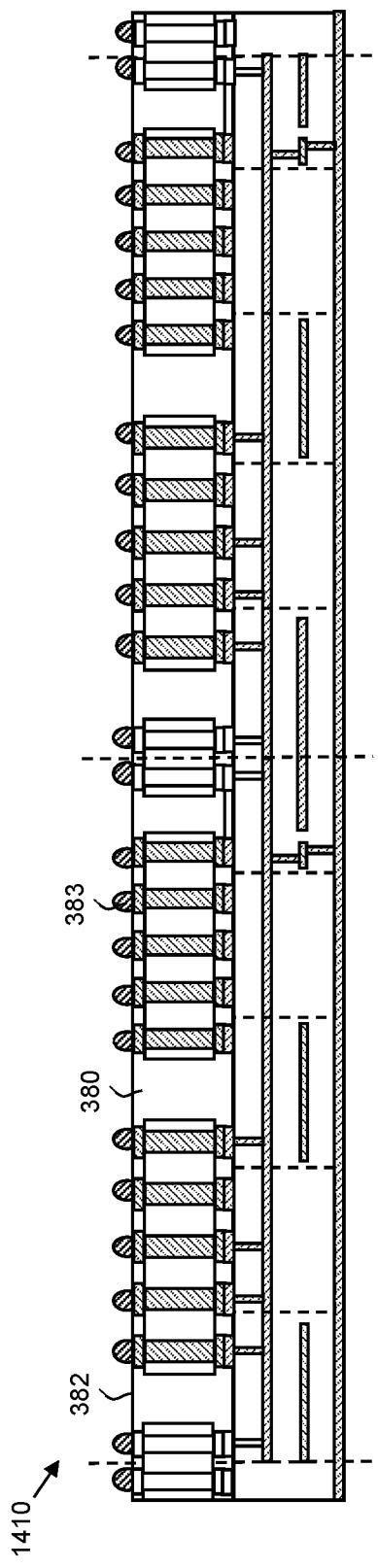
FIG. 14A
FIG. 14B

CIRCUIT MODULES WITH FRONT-SIDE INTERPOSER TERMINALS AND THROUGH-MODULE THERMAL DISSIPATION STRUCTURES

TECHNICAL FIELD

Embodiments of the subject matter described herein relate generally to circuit modules, and more particularly to power amplifier modules that include power transistor dies.

BACKGROUND

Wireless communication systems employ power amplifier modules for increasing the power of radio frequency (RF) signals. A power amplifier module includes a module substrate and amplifier circuitry coupled to a mounting surface of the module substrate. A typical module substrate also may include input and output (I/O) terminals on a bottom surface of the module (i.e., the surface opposite the module mounting surface), and conductive signal routing structures extending through and across the module substrate between the I/O terminals and bondpads at the mounting surface. Further one or more ground/thermal dissipation structures may extend through the module substrate between the mounting and bottom surfaces.

The amplifier circuitry often includes a power transistor die, which has at least one integrated power transistor with a bottom-side conductive ground layer. The bottom-side conductive ground layer of the power transistor die is directly connected to the surface(s) of the ground/thermal dissipation structure(s) that are exposed at the mounting surface of the module substrate. Along with functioning to remove heat from the power transistor die, the ground/thermal dissipation structure(s) may function to provide a ground reference to the power transistor die.

To convey RF signals between the module substrate and the power transistor die, electrical connections are made between the bondpads at the mounting surface of the module substrate and the I/O bondpads of the power transistor die. When the integrated power transistor is a field effect transistor (FET), the die's input bondpad connects to the gate terminal of the FET, and the die's output bondpad connects to the drain terminal of the FET. The source terminal of the FET is coupled through the die to the bottom-side, conductive ground layer, which in turn is connected to the ground/thermal dissipation structure(s) of the module substrate, as described above.

To integrate the above-described power amplifier module into a communication system, the module typically is coupled to a mounting surface of a system printed circuit board (PCB). More specifically, the module substrate bottom surface is connected to the top surface of the system PCB so that bottom-side module signal I/O terminals align with corresponding signal I/O pads on the PCB mounting surface. In addition, the module substrate is connected to the system PCB so that the module ground/thermal dissipation structure(s) contact a PCB heat spreader that extends through the system PCB. Accordingly, the combination of the module ground/thermal dissipation structure and the system PCB heat spreader may perform the dual function of providing a thermal pathway to remove heat generated by the power transistor die, and providing a ground reference to the power transistor die.

During operation, the power transistor amplifies input RF signals received through the transistor die input bondpad, and conveys the amplified RF signal to the transistor die output bondpad. All the while, heat generated by the power transistor die is dissipated through the ground/thermal dissipation structure(s) embedded in the module substrate and through the system PCB heat spreader, and a ground reference also is provided through the ground/thermal dissipation structure(s) and the system PCB heat spreader.

The above-described configuration works well for many applications. However, other applications may require a different configuration in which a thermal path for the heat produced by the power transistor die extends in a direction away from the system PCB, rather than through the system PCB. Such different configurations generate new challenges, however, including challenges associated with providing input/output signals, bias voltages, and an adequate ground reference for the power transistor die.

BRIEF DESCRIPTION OF THE DRAWINGS

A more complete understanding of the subject matter may be derived by referring to the detailed description and claims when considered in conjunction with the following figures, wherein like reference numbers refer to similar elements throughout the figures.

FIGS. 5A, 5B, and 5C are top and side views of terminal interposers, in accordance with two example embodiments;

FIGS. 6A and 6B are top and side views of a terminal interposer, in accordance with yet another example embodiment;

FIGS. 7A and 7B are top and side views of a shield/ground interposer, in accordance with an example embodiment;

FIG. 8 is a perspective view of a shield/ground interposer, in accordance with another example embodiment;

FIGS. 9A and 9B are top and side views of a shield/ground interposer, in accordance with yet another example embodiment;

FIGS. 14A and 14B are side views of the panel of module substrates of FIG. 13 at a third and fourth stages of manufacture, in accordance with an example embodiment;

DETAILED DESCRIPTION

Embodiments of the inventive subject matter described herein include amplifier systems with a system substrate (e.g., a printed circuit board (PCB)) and a power amplifier module coupled to the system substrate. The power amplifier module includes a module substrate with a mounting surface, an embedded heat dissipation structure that extends through the module substrate, a power amplifier die at the mounting surface and connected to the embedded heat dissipation structure, and one or more terminal, shield, and/or ground interposers connected to the mounting surface. The power amplifier module is mounted to the system substrate in a "flipped orientation" with the embedded heat dissipation structure facing away from the system substrate, in contrast with conventional systems in which the embedded heat dissipation structure is coupled to a heat spreader in the system substrate. Accordingly, in an embodiment, a heat sink may be connected directly to the exposed surface of the embedded heat dissipation structure of the power amplifier module.

The power amplifier module embodiments described herein may be utilized to implement any of a variety of different types of power amplifiers. To provide a concrete example that will help to convey the details of the inventive subject matter, an example of a Doherty power amplifier module is utilized herein. However, those of skill in the art will understand, based on the description herein, that the inventive subject matter may be utilized in power amplifier modules that implement other types of amplifiers, as well, and/or in electronic circuit modules other than power amplifier modules. Accordingly, the use of a Doherty power amplifier in the example embodiments below is not meant to limit application of the inventive subject matter only to Doherty power amplifier modules, as the inventive subject matter may be used in other types of power amplifier or electronic circuit modules, as well.

Figure 1:
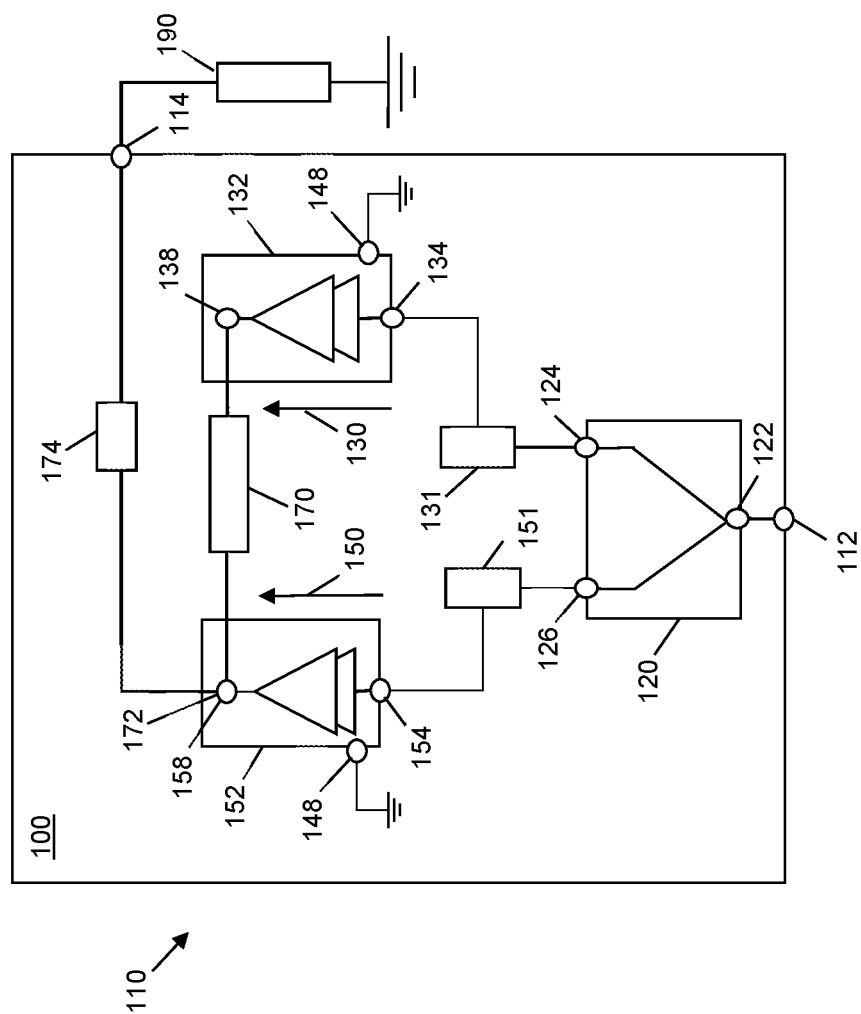
FIG. 1 is a schematic depiction of a Doherty power amplifier in a power amplifier module.

Prior to describing various physical implementations of power amplifier modules, reference is made to FIG. 1, which is a schematic depiction of a Doherty power amplifier 110 implemented in a power amplifier module 100. Power amplifier module 100 essentially includes a Doherty amplifier 110 implemented on a module substrate (e.g., module substrate 210, FIG. 2). Doherty amplifier 110 includes an RF input terminal 112, an RF output terminal 114, a power splitter 120, a carrier amplifier path 130 with one or more carrier amplifier dies (e.g., dies 233, 234, FIG. 2), a peaking amplifier path 150 with one or more peaking amplifiers (e.g., dies 253, 254, FIG. 2), a phase delay and impedance inversion element 170, and a combining node 172, in an embodiment.

As will be discussed in more detail later, each of the RF input terminal 112 and RF output terminal 114 may be implemented with an embodiment of a terminal interposer (e.g., terminal interposers 241, 246, FIG. 2), in an embodiment. In addition, as will be discussed in more detail below, power amplifier module 100 also includes one or more ground terminals 148, which are configured to provide an external ground reference to the power amplifier dies of the carrier and peaking amplifier paths 130, 150, according to various embodiments. As will be described in more detail below, the ground terminals 148 also may be implemented with an embodiment of a shield/ground interposer (e.g., ground terminals 248 of a shield/ground interposer 247, FIG. 2), that is positioned in close proximity to the power amplifier dies in order to optimize the ground return loops for the dies, in accordance with various embodiments.

When incorporated into a larger RF system, the RF input terminal 112 is coupled to an RF signal source, and the RF output terminal 114 is coupled to a load 190 (e.g., an antenna or other load). The RF signal source provides an input RF signal, which is an analog signal that includes spectral energy that typically is centered around one or more carrier frequencies. Fundamentally, the Doherty amplifier 110 is configured to amplify the input RF signal, and to produce an amplified RF signal at the RF output terminal 114.

The power splitter 120 has an input 122 and two outputs 124, 126, in an embodiment. The power splitter input 122 is coupled to the RF input terminal 112 to receive the input RF signal. The power splitter 120 is configured to divide the RF input signal received at input 122 into first and second RF signals (or carrier and peaking signals), which are provided to the carrier and peaking amplifier paths 130, 150 through outputs 124, 126, respectively. According to an embodiment, the power splitter 120 includes a first phase shift element, which is configured to impart a first phase shift (e.g., about a 90 degree phase shift) to the peaking signal before it is provided to output 126. Accordingly, at outputs 124 and 126, the carrier and peaking signals may be about 90 degrees out of phase from each other.

When Doherty amplifier 110 has a symmetrical configuration (i.e., a configuration in which the carrier and peaking amplifier power transistors are substantially identical in size), the power splitter 120 may divide or split the input RF signal received at the input 122 into two signals that are very similar with, in some embodiments, equal power. Conversely, when Doherty amplifier 110 has an asymmetrical configuration (i.e., a configuration in which one of the amplifier power transistors, typically the peaking amplifier transistor, is significantly larger), the power splitter 120 may output carrier and peaking signals having unequal power.

The outputs 124, 126 of the power splitter 120 are connected to the carrier and peaking amplifier paths 130, 150, respectively. The carrier amplifier path 130 is configured to amplify the carrier signal from the power splitter 120, and to provide the amplified carrier signal to the power combining node 172. Similarly, the peaking amplifier path 150 is configured to amplify the peaking signal from the power splitter 120, and to provide the amplified peaking signal to the power combining node 172, where the paths 130, 150 are designed so that the amplified carrier and peaking signals arrive in phase with each other at the power combining node 172.

According to an embodiment, the carrier amplifier path 130 includes an input circuit 131 (e.g., including an impedance matching circuit), a carrier amplifier 132 implemented using one or more carrier amplifier dies (e.g., dies 233, 234, FIG. 2), and a phase shift and impedance inversion element 170.

The carrier amplifier 132 includes an RF input terminal 134, an RF output terminal 138, and one or more amplification stages coupled between the input and output terminals 134, 138, in various embodiments. The RF input terminal 134 is coupled through input circuit 131 to the first output 124 of the power splitter 120, and thus the RF input terminal 134 receives the carrier signal produced by the power splitter 120.

Each amplification stage of the carrier amplifier 132 includes a power transistor. In a single-stage carrier amplifier 132, a single power transistor may be implemented on a single power amplifier die. In a two-stage carrier amplifier 132, two power transistors may be implemented on a single power amplifier die, or each power amplifier may be implemented on a separate die (e.g., dies 233, 234, FIG. 2), as will be exemplified in the power amplifier module depicted in FIG. 2.

Either way, each power transistor includes a control terminal (e.g., a gate terminal) and first and second current-carrying terminals (e.g., a drain terminal and a source terminal). In a single-stage device, which would include a single power transistor, the control terminal is electrically connected to the RF input terminal 134, one of the current-carrying terminals (e.g., the drain terminal) is electrically connected to the RF output terminal 138, and the other current-carrying terminal (e.g., the source terminal) is electrically connected through ground terminal 148 to the ground reference (or another voltage reference). Conversely, a two-stage amplifier would include two power transistors coupled in series, where a first transistor functions as a driver amplifier transistor that has a relatively low gain, and a second transistor functions as a final-stage amplifier transistor that has a relatively high gain. In such an embodiment, the control terminal of the driver amplifier transistor is electrically connected to the RF input terminal 134, one of the current-carrying terminals of the driver amplifier transistor (e.g., the drain terminal) may be electrically connected to the control terminal of the final-stage amplifier transistor, and the other current-carrying terminal of the driver amplifier transistor (e.g., the source terminal) is electrically connected through ground terminal 148 to the ground reference (or another voltage reference). Additionally, one of the current-carrying terminals of the final-stage amplifier transistor (e.g., the drain terminal) is electrically connected to the RF output terminal 138, and the other current-carrying terminal of the final-stage amplifier transistor (e.g., the source terminal) may be electrically connected through ground terminal 148 to the ground reference (or another voltage reference).

In addition to the power transistor(s), portions of input and output impedance matching networks and bias circuitry (not illustrated in FIG. 1) also may be included within the carrier amplifier 132 and/or electrically coupled to the carrier amplifier 132. The bias voltages may be provided, for example, through an embodiment of a terminal interposer (e.g., terminal interposer 244, FIG. 2), in an embodiment. Further, in an embodiment in which the carrier amplifier 132 is a two-stage device, an interstage matching network (not illustrated in FIG. 1) also may be included within the carrier amplifier 132 between the driver and final-stage amplifier transistors.

The RF output terminal 138 of the carrier amplifier 132 is coupled to the power combining node 172 through phase shift and impedance inversion element 170, in an embodiment. According to an embodiment, the impedance inversion element is a lambda/4 ($\lambda/4$) transmission line phase shift element (e.g., a microstrip line), which imparts about a 90 degree relative phase shift to the carrier signal after amplification by the carrier amplifier 132. A first end of the impedance inversion element 170 is coupled to the RF output terminal 138 of the carrier amplifier 132, and a second end of the phase shift element 170 is coupled to the power combining node 172.

Reference is now made to the peaking amplifier path 150, which includes a peaking amplifier 152 and an input circuit 151 (e.g., including an impedance matching circuit), in an embodiment. The peaking amplifier 152 includes an RF input terminal 154, an RF output terminal 158, and one or more amplification stages coupled between the input and output terminals 154, 158, in various embodiments. The RF input terminal 154 is coupled to the second output 126 of the power splitter 120, and thus the RF input terminal 154 receives the peaking signal produced by the power splitter 120.

As with the carrier amplifier 132, each amplification stage of the peaking amplifier 152 includes a power transistor with a control terminal and first and second current-carrying terminals. The power transistor(s) of the peaking amplifier 152 may be electrically coupled between the RF input and output terminals 154, 158 and to the ground terminal 148 in a manner similar to that described above in conjunction with the description of the carrier amplifier 132. Additional other details discussed with in conjunction with the description of the carrier amplifier 132 also apply to the peaking amplifier 152, and those additional details are not reiterated here for brevity. However, one important point to reiterate is that a current-carrying terminal of each peaking amplifier transistor (e.g., the source terminal of a driver and/or final-stage peaking amplifier transistor) may be electrically connected through an embodiment of a ground terminal 148 to the ground reference (or another voltage reference), as described above in conjunction with the description of the carrier amplifier 132.

The RF output terminal 158 of the peaking amplifier 152 is coupled to the power combining node 172. According to an embodiment, the RF output terminal 158 of the peaking amplifier 152 and the combining node 172 are implemented with a common element. More specifically, in an embodiment, the RF output terminal 158 of the peaking amplifier 152 is configured to function both as the combining node 172 and as the output terminal 158 of the peaking amplifier 152. To facilitate combination of the amplified carrier and peaking signals, and as mentioned above, the RF output terminal 158 (and thus the combining node 172) is connected to the second end of the phase shift and impedance inversion element 170. In other embodiments, the combining node 172 may be a separate element from the RF output terminal 158.

Either way, the amplified carrier and peaking RF signals combine in phase at the combining node 172. The combining node 172 is electrically coupled to the RF output terminal 114 to provide the amplified and combined RF output signal to the RF output terminal 114. In an embodiment, an output impedance matching network 174 between the combining node 172 and the RF output terminal 114 functions to present proper load impedances to each of the carrier and peaking amplifier 132, 152. The resulting amplified RF output signal is produced at RF output terminal 114, to which an output load 190 (e.g., an antenna) is connected.

Amplifier 110 is configured so that the carrier amplifier path 130 provides amplification for relatively low level input signals, and both amplification paths 130, 150 operate in combination to provide amplification for relatively high level input signals. This may be accomplished, for example, by biasing the carrier amplifier 132 so that the carrier amplifier 132 operates in a class AB mode, and biasing the peaking amplifier 152 so that the peaking amplifier 152 operates in a class C mode.

In the embodiment illustrated in FIG. 1 and described above, a first phase shift element in splitter 120 imparts about 90 degrees of phase shift to the peaking signal prior to amplification, and phase shift and impedance inversion element 170 similarly imparts about 90 degrees of phase shift to the amplified carrier signal so that the amplified carrier and peaking signals may combine in phase at the combining node 172. Such an architecture is referred to as a non-inverted Doherty amplifier architecture. In an alternate embodiment, a first phase shift element in splitter 120 may impart about 90 degrees of phase shift to the carrier signal prior to amplification, rather than to the peaking signal, and phase shift and impedance inversion element 170 may be included instead at the output of the peaking amplifier. Such an alternate architecture is referred to as an inverted Doherty amplifier architecture. In still other alternate embodiments, other combinations of phase shift elements may be implemented in the carrier and/or peaking paths 130, 150 prior to amplification to achieve about 90 degrees of phase difference between the carrier and peaking signals prior to amplification, and the phase shifts applied to the amplified carrier and peaking signals may be selected accordingly to ensure that the signals combine in phase at combining node 172.

Figure 2:
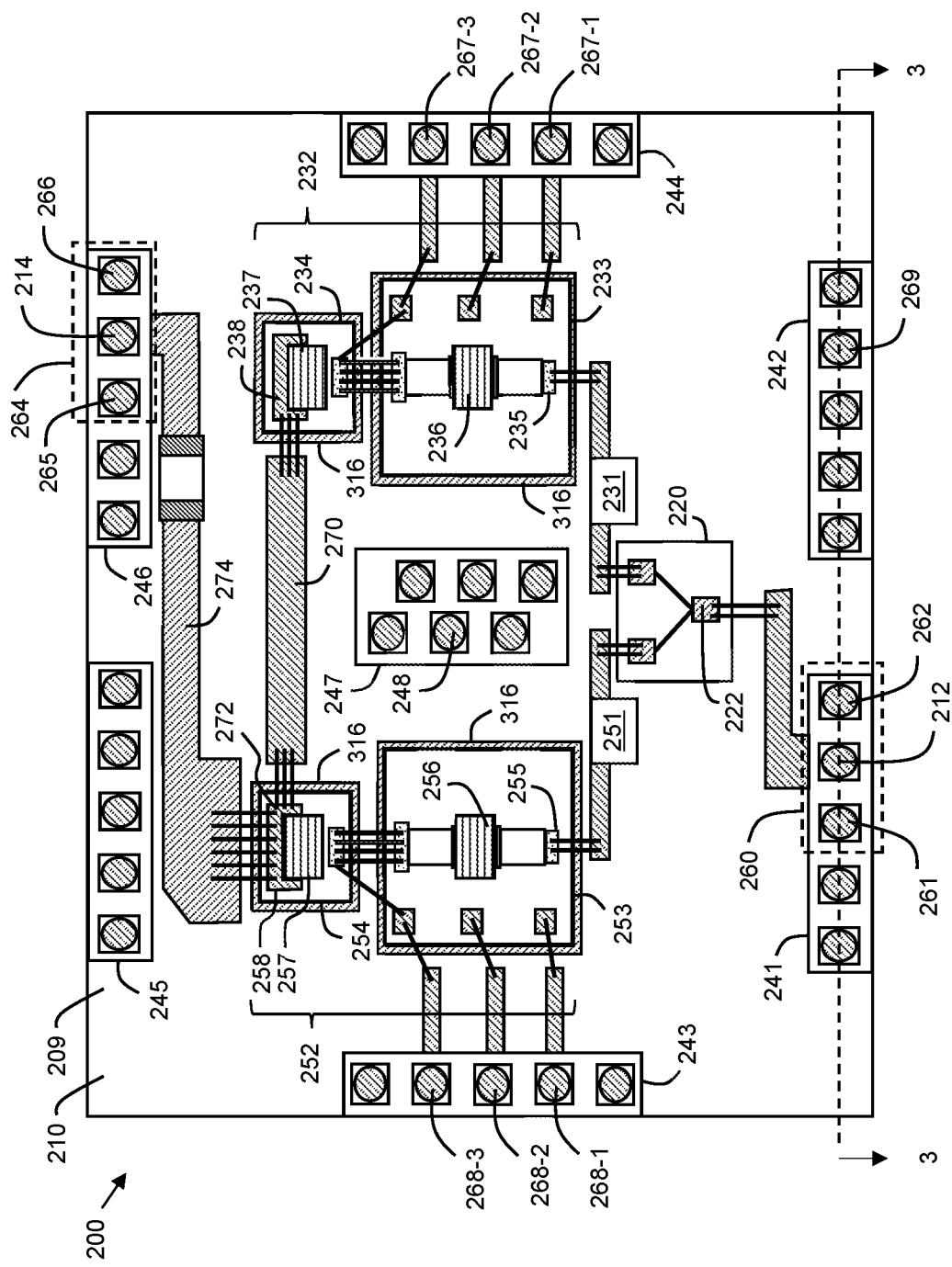
FIG. 2 is a top view of a power amplifier module that embodies the Doherty power amplifier of FIG. 1, in accordance with an example embodiment.

FIG. 2 is a top view of a power amplifier module 200 that embodies the Doherty amplifier circuitry of FIG. 1, in accordance with an example embodiment. To enhance understanding, FIG. 2 should be viewed simultaneously with FIG. 3, which is a cross-sectional, side view of the module 200 of FIG. 2 along line 3-3. Essentially, power amplifier module 200 includes a Doherty power amplifier (e.g., power amplifier 110, FIG. 1) implemented with a multi-layer module substrate 210 and a plurality of power transistor dies 233, 234, 253, 254 and other electrical components. In addition, power amplifier module 200 includes a plurality of interposers 241-247, each of which includes one or more terminals (e.g., terminals 212, 214, 261, 262, 265, 266, 267-1, 267-2, 267-3, 268-1, 268-2, 268-3) for conveying signals or bias voltages, or for connecting to ground references, as will be discussed in detail below. Various components of power amplifier module 200 correspond with components depicted in FIG. 1, and it should be noted that corresponding components between FIG. 1 and FIGS. 2-3 have the same last two numerical digits (e.g., components 120 and 220 are corresponding components).

Figure 3:
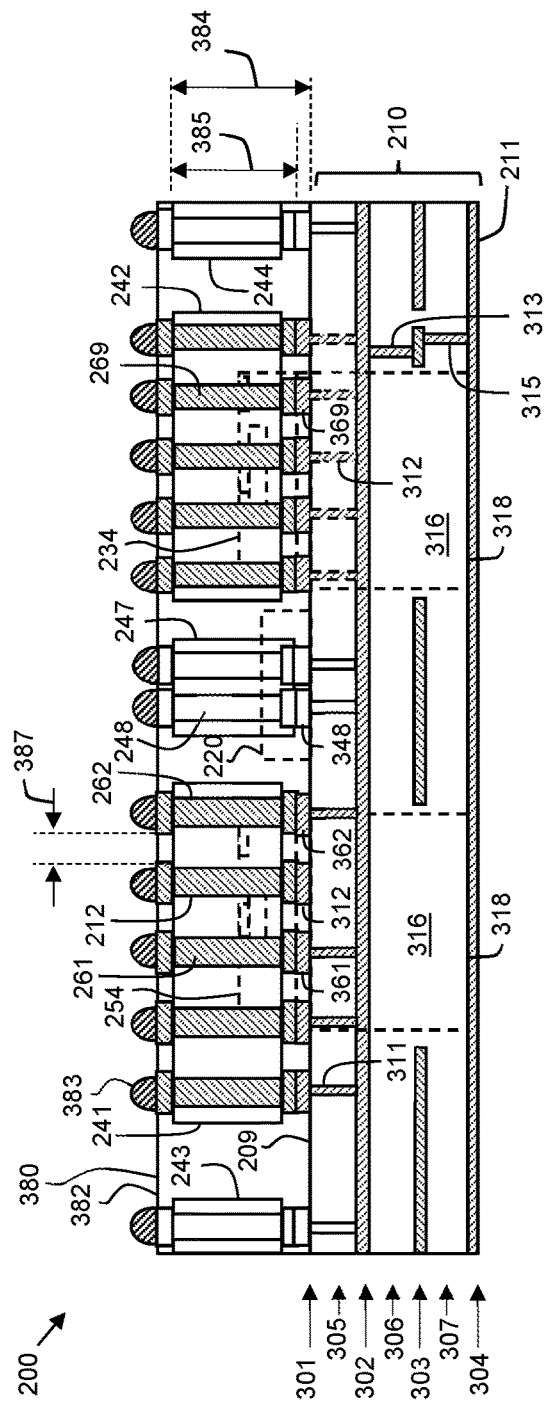
FIG. 3 is a cross-sectional, side view of the power amplifier module of FIG. 2 along line 3-3.

Power amplifier module 200 includes a module substrate 210 in the form of a multiple-layer printed circuit board (PCB) or other suitable substrate. The module substrate 210 has a top surface 209 (also referred to as a "front-side" or "mounting surface") and a bottom surface 211 (also referred to as a "back-side" or "heat sink attachment surface"). As will be described in more detail below, a plurality of components and the interposers 241-247 are coupled to the mounting surface 209 of the module substrate 210, and non-conductive encapsulant material 380 (e.g., a plastic encapsulant) is disposed on the mounting surface 209 and over and around the components and interposers 241-247 to define a top surface 382 (also referred to as a "contact surface") of the module 200. As shown in FIG. 3, the encapsulant material 380 has a thickness 384 that is greater than the maximum height of the components (e.g., splitter 220 and power transistor dies 233, 234, 253, 254) covered by the encapsulant material 380. In some embodiments, the thickness 384 is about equal to the height 385 of the interposers 241-247, although the thickness 384 may be slightly less or greater than the height 385 of the interposers 241-247, in other embodiments.

As will also be described in more detail below, lower or proximal surfaces of the interposers 241-247, and more particularly proximal ends of the terminals (e.g., terminals 212, 214, 248, 261, 262, 265, 266, 267-1, 267-2, 267-3, 268-1, 268-2, 268-3, 269) embedded within the interposers 241-247, are coupled to conductive features on the mounting surface 209 of the module substrate 210. Upper or distal surfaces of the interposers 241-247, and more particularly distal ends of the terminals, are exposed at the contact surface 382 of the encapsulant material 380. Conductive attachment material 383 (e.g., solder balls, solder paste, or conductive adhesive) is disposed on the exposed distal ends of the terminals to facilitate electrical and mechanical attachment of the module 200 to a system substrate (e.g., system substrate 1010, FIG. 10), as will be described in more detail later. Various features and embodiments of interposers 241-247 and their embedded terminals will be discussed later in more detail.

As depicted in FIG. 3, the module substrate 210 includes a plurality of dielectric layers 305, 306, 307 (e.g., formed from FR-4, ceramic, or other PCB dielectric materials), in an alternating arrangement with a plurality of conductive layers 301, 302, 303, 304, where a top surface 209 of the module substrate 210 is defined by a patterned conductive layer 301, and a bottom surface 211 of the module substrate 210 is defined by a conductive layer 304. It should be noted that, although module substrate 210 is shown to include three dielectric layers 305-307 and four conductive layers 301-304, other embodiments of a module substrate may include more or fewer dielectric layers and/or conductive layers.

Each of the various conductive layers 301-304 may have a primary purpose, and also may include conductive features that facilitate signal and/or voltage/ground routing between other layers. Although the description below indicates a primary purpose for each of the conductive layers 301-304, it should be understood that the layers (or their functionality) may be arranged differently from the particular arrangement best illustrated in FIG. 3 and discussed below.

For example, in an embodiment, the patterned conductive layer 301 at the mounting surface 209 of the module substrate 210 may primarily function as a signal conducting layer. More specifically, layer 301 includes a plurality of conductive features (e.g., conductive pads and traces) which serve as attachment points for dies 233, 234, 253, 254 and other discrete components, and also provide electrical connectivity between the dies 233, 234, 253, 254 and the other discrete components.

In addition, as will be discussed below, layer 301 may include a plurality of conductive pads (e.g., pads 312, 361, 362, FIG. 3) that are specifically designated for attachment of electrically conductive signal, bias, and/or ground terminals (e.g., terminals 212, 214, 248, 261, 262, 265, 266, 267-1, 267-2, 267-3, 268-1, 268-2, 268-3) within interposers 241-247, embodiments of which will be described in more detail in conjunction with FIGS. 5A-C, 6A-B, 7A-B, 8, and 9A-B. Layer 301 also may include a plurality of "dummy" pads (e.g., pad 369) to which "dummy" terminals (e.g., terminal 269) may be attached. As used herein, a "dummy" terminal of an interposer is a terminal that is not assigned any particular function in the amplifier, and is not coupled to any active circuitry. In various embodiments, the dummy terminals 269 and dummy pads 369 may be left electrically floating (i.e., not coupled to ground or other circuitry), or alternatively may be coupled to a ground layer (e.g., ground layer 302, as indicated with optional dashed line vias 312).

A second patterned conductive layer 302 functions as an RF ground layer, in an embodiment. The RF ground layer 302 also includes a plurality of conductive features (e.g., conductive traces), which may be electrically coupled to conductive features of the signal conducting layer 301 and to a system ground layer 304 (described below) with conductive vias 311, 313, 315 that extend through the dielectric layers 305-307. For example, conductive ground terminal pads 361, 362 are electrically coupled through vias 311 to the RF ground layer 302, and the RF ground layer 302 is, in turn, electrically coupled through vias 313, 315 (and routing features of conductive layer 303) to the system ground layer 304.

A third patterned conductive layer 303 functions to convey bias voltages to power transistors 236, 237, 256, 257 within the dies 233, 234, 253, 254, and also may function as a routing layer, as mentioned above. Finally, a fourth conductive layer 304 functions as a system ground layer and also as a heat sink attachment layer, as will be explained in more detail in conjunction with FIG. 10.

According to an embodiment, module substrate 210 also includes one or more thermal dissipation structures 316, which extend between the top and bottom surfaces 209, 211 of the module substrate 210. The dies 233, 234, 253, 254 are physically and electrically coupled to surfaces of the thermal dissipation structures 316 that are exposed at the top surface 209 of the module substrate 210. The bottom surfaces 318 of the thermal dissipation structures 316 may be exposed at the bottom surface 211 of the module substrate 210, or the bottom surfaces 318 of the thermal dissipation structures 316 may be covered with the bottom conductive layer 304, as shown in FIG. 3. Either way, the thermal dissipation structures 316 are configured to provide a thermal pathway between the dies 233, 234, 253, 254 and the bottom surfaces 318 of the thermal dissipation structures 316 (and thus the bottom surface 211 of the module substrate 210). In various embodiments, the thermal dissipation structures 316 may include conductive metallic coins that are press-fit and/or attached into through-holes that extend between the surfaces 209, 211 of the module substrate 210. In alternate embodiments, each of the thermal dissipation structures 316 may include a plurality (or set) of conductive thermal vias (e.g., circular or bar vias) that extend between the surfaces 209, 211 of the module substrate 210. As will be described in more detail in conjunction with FIG. 10, the exposed bottom surfaces 318 of the thermal dissipation structures 316 (or the portion of the conductive layer 304 overlying those surfaces 318) are physically and thermally coupled to a heat sink (e.g., heat sink 1016, FIG. 10) when the module 200 is integrated within a larger electrical system.

The power amplifier module 200 further includes an RF signal input terminal 212 (e.g., RF input terminal 112, FIG. 1), a power splitter 220 (e.g., power splitter 120, FIG. 1), a two-stage, carrier amplifier 232 (e.g., amplifier 132, FIG. 1), a two-stage peaking amplifier 252 (e.g., amplifier 152, FIG. 1), various phase shift and impedance matching elements, a combining node 272 (e.g., combining node 172, FIG. 1), an output impedance matching network 274 (e.g., network 174, FIG. 1), and an RF signal output terminal 214 (e.g., RF output terminal 114, FIG. 1).

Terminal 212 functions as the RF signal input terminal for the module 200. According to an embodiment, terminal 212 is embedded within terminal interposer 241, and is coupled to an RF signal input pad 312 at the mounting surface 209 of the module substrate 210. Through one or more conductive structures (e.g., vias, traces, and/or wirebonds, as shown), the RF signal input pad 312 is electrically coupled to an input 222 to the power splitter 220.

Similarly, terminal 214 functions as the RF signal output terminal for the module 200. According to an embodiment, terminal 214 is embedded within terminal interposer 246, and is coupled to an RF signal output pad (not illustrated) at the mounting surface 209 of the module substrate 210. Through one or more conductive structures (e.g., vias, traces, and/or wirebonds), the RF signal output pad is electrically coupled to the combining node 272 (through network 274).

According to an embodiment, ground terminals 261, 262, 265, 266 also are embedded within terminal interposers 241, 246 "next to" and "in close proximity" to RF input and output terminals 212, 214 in order to provide GSG (ground-signal-ground) terminal structures 260, 264 for the RF input and for the RF output of the module 200. More particularly, a first ground terminal 261 is positioned next to one side of RF input terminal 212, and a second ground terminal 262 is positioned next to the opposite side of RF input terminal 212. Similarly, a third ground terminal 265 is positioned next to one side of RF output terminal 214, and a fourth ground terminal 266 is positioned next to the opposite side of RF output terminal 214. As used herein, the phrase "in close proximity," in the above context, means that a physical distance (e.g., distance 387, FIG. 3) between a side of a ground terminal (e.g., ground terminal 261, 262, 265 or 266) and a nearest side of a signal terminal (e.g., signal terminal 212 or 214) is less than twice the width of the signal terminal. The term "next to," in the above context, means that no other terminals or intervening electrical structures are present between a ground terminal (e.g., ground terminal 265 or 266) and a signal terminal (e.g., signal terminal 212 or 214). Instead, only the dielectric material of the interposer (e.g., interposer 260 or 264) is present between the ground terminal and the signal terminal.

Each of the ground terminals 261, 262, 265, 266 have a proximal end that is coupled to a ground pad (e.g., ground pads 361, 362, FIG. 3), which in turn is electrically coupled to ground layers 302 and/or 304, thus "grounding" the ground terminals of each GSG terminal structure 260, 264. By implementing GSG terminal structures for the RF input and for the RF output of the module 200, the length of the return current loop associated with the terminal structure may be very short. In addition, radiated electromagnetic energy from the RF input and output terminals 212, 214 may be terminated to ground by the proximate ground terminals 261, 262, 265, 266, which avoids potential performance issues that may otherwise occur when the radiated electromagnetic energy is permitted to reach other portions of the module.

The power splitter 220 (e.g., power splitter 120, FIG. 1), which is coupled to the mounting surface 209 of the system substrate 210, may include one or more discrete die and/or components, although it is represented in FIG. 2 as a single element. The power splitter 220 includes an input terminal 222 and two output terminals (not numbered, but corresponding to terminals 124, 126, FIG. 1). The input terminal 222 is electrically coupled through one or more conductive structures (e.g., vias, traces, and/or wirebonds, as shown) to the RF signal input pad 312 and to the RF signal input terminal 212, and thus is configured to receive an input RF signal. The output terminals of the power splitter 220 are electrically coupled through one or more conductive structures (e.g., vias, traces, and/or wirebonds) and input circuits 231, 251 (e.g., input circuits 131, 151, FIG. 1) to inputs 235, 255 for the carrier and peaking amplifiers 232, 252, respectively.

The power splitter 220 is configured to split the power of the input RF signal received through the RF input terminal 212 into first and second RF signals, which are produced at the output terminals of the power splitter 220. In addition, the power splitter 220 may include one or more phase shift elements configured to impart about a 90 degree phase difference between the RF signals provided at the splitter output terminals. The first and second RF signals produced at the outputs of the power splitter 220 may have equal or unequal power, as described previously.

The first output of the power splitter is electrically coupled to a carrier amplifier path (i.e., to the carrier amplifier 232 or carrier amplifier path 130, FIG. 1), and the second output of the power splitter is electrically coupled to a peaking amplifier path (i.e., to the peaking amplifier 252 or peaking amplifier path 150, FIG. 1). The RF signal produced at the second power splitter output may be delayed by about 90 degrees from the RF signal produced at the first power splitter output. In other words, the RF signal provided to the peaking amplifier path may be delayed by about 90 degrees from the RF signal provided to the carrier amplifier path. In any event, the first RF signal produced by the power splitter 220 is amplified through the carrier amplifier path 232, and the second RF signal produced by the power splitter 220 is amplified through the peaking amplifier path 252.

In the specific embodiment of FIG. 2, each of the carrier and peaking amplifier paths includes a two-stage power amplifier 232, 252, where a driver-stage transistor 236, 256 is implemented on a driver-stage die 233, 253, and a final-stage transistor 237, 257 is implemented on a separate final-stage die 234, 254. For example, each of the transistors 236, 237, 256, 257 may be field effect transistors (FETs), such as laterally-diffused metal oxide semiconductor (LDMOS) FETs or high electron mobility transistors (HEMTs). The description and claims may refer to each transistor as including a control terminal and two current-conducting terminals. For example, using terminology associated with FETs, a "control terminal" refers to a gate terminal of a transistor, and first and second current-conducting terminals refer to drain and source terminals (or vice versa) of a transistor. Although the below description may use terminology commonly used in conjunction with FET devices, the various embodiments are not limited to implementations the utilize FET devices, and instead are meant to apply also to implementations that utilize bipolar junction transistors (BJT) devices or other suitable types of transistors.

The carrier amplifier 232 more specifically includes a silicon driver-stage die 233 and a gallium nitride (GaN) final-stage die 234, and the peaking amplifier 252 also includes a silicon driver-stage die 253 and a GaN final-stage die 254, in accordance with an example embodiment. In other embodiments, each of the carrier and peaking amplifiers 232, 252 may include a two-stage power amplifier implemented on a single die, or each of the carrier and peaking amplifiers 232, 252 may include a single-stage power amplifier implemented on a single die. In still other embodiments, each of the carrier and peaking amplifiers may include a two-stage power amplifier implemented on separate driver and final-stage dies, but the driver and final-stage dies may be formed using the same semiconductor technology (e.g., both the driver and final-stage dies are silicon dies or GaN dies), or the driver and/or final-stage dies may be formed using different semiconductor technologies than those described above (e.g., the driver and/or final-stage dies may be formed from silicon germanium (SiGe) and/or gallium arsenide (GaAs) die).

The carrier amplifier path includes the above-mentioned driver stage die 233, the final-stage die 234, and a phase shift and impedance inversion element 270 (e.g., element 170, FIG. 1). The driver stage die 233 and the final-stage die 234 of the carrier amplifier path 232 are electrically coupled together in a cascade arrangement between an input terminal 235 of the driver stage die 233 (corresponding to a carrier amplifier input) and an output terminal 238 of the final-stage die 234 (corresponding to a carrier amplifier output).

The driver stage die 233 includes a plurality of integrated circuits. In an embodiment, the integrated circuitry of die 233 includes a series-coupled arrangement of the input terminal 235 (e.g., input terminal 135, FIG. 1), an input impedance matching circuit (not numbered), a silicon power transistor 236, an integrated portion of an interstage impedance matching circuit (not numbered), and an output terminal not numbered, in an embodiment. More specifically, the gate of the transistor 236 is electrically coupled through the input impedance matching circuit to the input terminal 235, and the drain of the transistor 236 is electrically coupled through the output impedance matching circuit to the output terminal of die 233. The source of transistor 236 is electrically coupled to a conductive layer (or source terminal) on a bottom surface of die 233, and the bottom conductive layer is physically, electrically, and thermally coupled to the exposed top surface of a thermal dissipation structure 316.

The output terminal of the driver stage die 233 is electrically coupled to the input terminal of the final-stage die 234 through a wirebond array (not numbered) or another type of electrical connection. The final-stage die 234 also includes a plurality of integrated circuits. In an embodiment, the integrated circuitry of die 234 includes a series-coupled arrangement of an input terminal (not numbered), a GaN power transistor 237, and an output terminal 238 (e.g., output terminal 138, FIG. 1). More specifically, the gate of the transistor 237 is electrically coupled to the input terminal of die 234, and the drain of the transistor 237 is electrically coupled to the output terminal 238 of die 234. The source of transistor 237 is electrically coupled to a conductive layer on a bottom surface of die 234, and the bottom conductive layer is physically, electrically, and thermally coupled to the exposed top surface of a thermal dissipation structure 316.

The peaking amplifier path includes the above-mentioned driver stage die 253 and the final-stage die 254. The driver stage die 253 and the final-stage die 254 of the peaking amplifier path 252 are electrically coupled together in a cascade arrangement between an input terminal 255 of the driver stage die 253 (corresponding to a peaking amplifier input) and an output terminal 258 of the final-stage die 254 (corresponding to a peaking amplifier output).

The driver stage die 253 includes a plurality of integrated circuits. In an embodiment, the integrated circuitry of die 253 includes a series-coupled arrangement of the input terminal 255 (e.g., input terminal 155, FIG. 1), an input impedance matching circuit (not numbered), a silicon power transistor 256, an integrated portion of an interstage impedance matching circuit (not numbered), and an output terminal not numbered, in an embodiment. More specifically, the gate of the transistor 256 is electrically coupled through the input impedance matching circuit to the input terminal 255, and the drain of the transistor 256 is electrically coupled through the output impedance matching circuit to the output terminal of die 253. The source of transistor 256 is electrically coupled to a conductive layer on a bottom surface of die 253, and the bottom conductive layer is physically, electrically, and thermally coupled to the exposed top surface of a thermal dissipation structure 316.

The output terminal of the driver stage die 253 is electrically coupled to the input terminal of the final-stage die 254 through a wirebond array (not numbered) or another type of electrical connection. The final-stage die 254 also includes a plurality of integrated circuits. In an embodiment, the integrated circuitry of die 254 includes a series-coupled arrangement of an input terminal (not numbered), a GaN power transistor 257, and an output terminal 258 (e.g., output terminal 158, FIG. 1). More specifically, the gate of the transistor 257 is electrically coupled to the input terminal of die 254, and the drain of the transistor 257 is electrically coupled to the output terminal 258 of die 254. The source of transistor 257 is electrically coupled to a conductive layer on a bottom surface of die 254, and the bottom conductive layer is physically, electrically, and thermally coupled to the exposed top surface of a thermal dissipation structure.

As mentioned previously, for proper Doherty operation, the carrier amplifier 232 may be biased to operate in a class AB mode, and the peaking amplifier 252 may be biased to operate in a class C mode. To accomplish this biasing, a plurality of gate and drain bias voltages may be provided by external bias voltage sources. According to an embodiment, the bias voltages are provided through bias terminals 267-1, 268-1, 267-2, 268-2, 267-3, 268-3 of one or more additional interposers 243, 244. More specifically, gate bias voltages for driver-stage transistors 236, 256 may be provided through driver gate bias terminals 267-1 and 268-2, drain bias voltages for driver-stage transistors 236, 256 may be provided through driver drain bias terminals 267-2, 268-2, and gate bias voltages for final-stage transistors 237, 257 may be provided through gate bias terminals 267-3, 268-3. Each of the terminals 267-1, 268-1, 267-2, 268-2, 267-3, 268-3 has a proximal end coupled to conductive structures (e.g., pads and traces) of conductive layer 301, and the conductive structures are electrically coupled (e.g., through wirebonds, as shown) to bias pads on the driver- and final-stage dies. In the illustrated embodiment, the gate and drain bias pads for both the driver- and final-stage transistors 236, 237, 256, 257 are located on the driver-stage dies 233, 253, and the gate bias voltage for the final-stage dies 234, 254 "hops" from the driver-stage dies 233, 253 to the final-stage dies 234, 254 through wirebond connections, as shown.

According to a further embodiment, module 200 also includes a "shield/ground" interposer 247 that is coupled to the mounting surface 209 of the module substrate 210 between the carrier and peaking amplifiers 232, 252. As will be described in more detail in conjunction with FIGS. 7A, 7B, 8, 9A, and 9B, the shield/ground interposer 247 provides a continuous or substantially continuous, electrically-conductive "wall", which functions to shunt electromagnetic energy produced by the driver- and/or final-stage dies 233, 234, 253, 254 (and/or wirebonds or other conductors coupled to those dies) to ground. Accordingly, the shield/ground interposer 247 may improve amplifier performance by reducing electromagnetic coupling between the carrier and peaking amplifiers 232, 252.

In the embodiment illustrated in FIG. 2 (and described in detail later in conjunction with FIGS. 7A, 7B), the shield/ground interposer 247 includes two, offset rows of ground terminals 248, where proximal ends of the ground terminals 248 are coupled to conductive ground pads 348 of conductive layer 301. The ground pads 348, in turn, are electrically coupled to ground layers 302 and/or 304, and either or both of the ground layers 302, 304 intersect and are physically and electrically coupled to the thermal dissipation structures 316. Thus, the source terminals (e.g., the bottom conductive layers of dies 233, 234, 253, 254) are "grounded" through layers 302, 304, the thermal dissipation structures 316, ground pads 348, and terminals 248. Accordingly, in addition to providing an electromagnetic shield, the ground terminals 248 of the shield/ground interposer 247 may be positioned relatively close (physically and electrically) to the source terminals (or conductive bottom layers) of the dies 233, 234, 253, 254, thus providing relatively short ground current loops for the dies 233, 234, 253, 254. This also may help to improve amplifier gain, among other performance metrics.

Returning again to the operation of amplifier module 200, an amplified carrier signal is produced at the output terminal 238 of the final-stage die 234, and an amplified peaking signal is produced at the output terminal 258 of the final-stage die 254, which also functions as the combining node 272 (e.g., node 172, FIG. 1) for the amplifier. According to an embodiment, the output terminal 238 of the carrier final-stage die 234 is electrically coupled (e.g., through wirebonds (not numbered) or another type of electrical connection) to a first end of the phase shift and impedance inversion element 270, and the output terminal 258 of the peaking final-stage die 254 is electrically coupled (e.g., through wirebonds (not numbered) or another type of electrical connection) to a second end of the phase shift and impedance inversion element 270.

According to an embodiment, the phase shift and impedance inversion element 270 may be implemented with a quarter-wavelength or lambda/4 ($\lambda/4$) or shorter transmission line (e.g., a microstrip transmission line with an electrical length up to about 90 degrees) that is formed from a portion of the conductive layer 301. As used herein, lambda is the wavelength of an RF signal at the fundamental frequency of operation of the amplifier (e.g., a frequency in a range of about 600 megahertz (MHz) to about 10 gigahertz (GHz) or higher). The combination of the phase shift and impedance inversion element 270 and the wirebond (or other) connections to the output terminals 238, 258 of dies 234, 254 may impart about a 90 degree relative phase shift to the amplified carrier signal as the signal travels from output terminal 238 to output terminal 258/combining node 272. When the various phase shifts imparted separately on the carrier and peaking RF signals through the carrier and peaking paths, respectively, are substantially equal, the amplified carrier and peaking RF signals combine substantially in phase at output terminal 258/combining node 272.

The output terminal 258/combining node 272 is electrically coupled (e.g., through wirebonds or another type of electrical connection) through an output impedance matching network 274 (e.g., network 174, FIG. 1) to RF output terminal 214 (e.g., terminal 114, FIG. 1). The output impedance matching network 274 functions to present the proper load impedances to each of carrier and peaking final-stage dies 234, 254. Although shown in a highly simplified form in FIG. 2, the output impedance matching network 274 may include various conductive traces, additional discrete components (e.g., capacitors, inductors, and/or resistors) between output terminal 258/combining node 272 and RF output terminal 214, which provide the desired impedance matching. As mentioned above and according to an embodiment, RF output terminal 214 and ground terminals 265, 266 are embedded within terminal interposer 246, and the ground terminals 265, 266 are positioned "next to" and "in close proximity" to RF output terminal 214 in order to provide a GSG terminal structure 264 for the RF output of the module 200.

In the example module 200 of FIG. 2, one or two "perimeter" interposers 241-246 are positioned at each of the four sides (or edges) of the substrate 210. In other embodiments, zero interposers or more than two interposers may be positioned at any given side of the module 200. Further, although each of the perimeter interposers 241-246 are shown to be identical in module 200, in other embodiments, the various perimeter interposers 241-246 may be different. Further still, although each of the perimeter interposers 241-246 are shown to include a single row of five terminals, some of the perimeter interposers 241-246 may have more terminals (e.g., up to 20 terminals or more), fewer terminals (e.g., as few as one terminal), and/or a different number of terminal rows.

Figure 4:
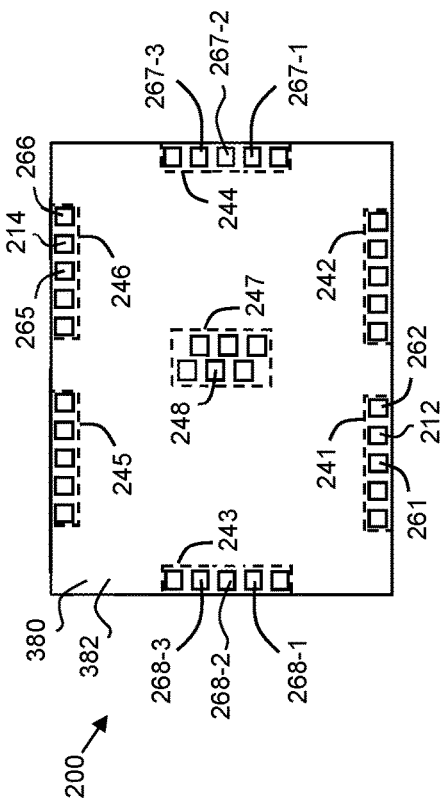
FIG. 4 depicts the front-side of a power amplifier module, in accordance with an example embodiment.

For ease of illustration and understanding, FIG. 2 depicts module 200 with encapsulant material 380 removed. A depiction of the front-side of power amplifier module 200 that includes the encapsulant material 380 is illustrated in FIG. 4. More specifically, FIG. 4 illustrates the contact surface 382 of the encapsulant material 380, at which the distal ends of terminals 212, 214, 261, 262, 265, 266, 267-1, 267-2, 267-3, 268-1, 268-2, 268-3 are exposed, essentially as a land grid array (LGA) of conductive contact pads. FIG. 4 also indicates the placement of interposers 241-247 (indicated with dashed boxes) below the contact surface 382.

Various embodiments of interposers that may be suitable for the terminal, shield/ground, and dummy interposers 241-247 of the module 200 of FIG. 2 will now be discussed in conjunction with FIGS. 5A-C, 6A-B, 7A-B, 8, and 9A-B. More specifically, FIGS. 5A and 5B illustrate top views of two embodiments of terminal interposers 500, 520 (e.g., interposers 241-246, FIG. 2), and FIG. 5C is a side, cross-sectional view of either terminal interposer 500, 520 along lines 5-5 of FIGS. 5A and 5B. FIG. 5A more specifically illustrates an interposer 500 that includes a single row 571 of interposer terminals 501-505, and FIG. 5B illustrates an interposer 520 that includes two rows 571, 573 of interposer terminals 501-510. Although each row 571, 573 of interposer terminals in FIGS. 5A and 5B includes five terminals, in other embodiments, a row of interposer terminals may include more or fewer terminals (e.g., each row may include from one to 20 terminals or more). In addition, an interposer may include more than two rows of terminals, in still other embodiments.

As best shown in the side, cross-sectional view of FIG. 5C, each interposer 500, 520 includes a dielectric body 592 (e.g., formed from FR-4, ceramic, or other suitable dielectric materials) with top and bottom surfaces 593, 594, and the terminals 501-510 are embedded within the dielectric body 592. Each interposer terminal 501-510 includes a conductive via 595 extending through the dielectric body 592 between its top and bottom surfaces 593, 594. In addition, conductive pads 596, 597 are deposited on the top and bottom surfaces 593, 594 in contact with first and second ends (or proximal and distal ends), respectively, of each conductive via 595. As indicated in FIGS. 5A and 5B, each conductive via 595 may have a circular cross-sectional shape. However, in other embodiments, each conductive via 595 alternatively may have a square, rectangular, or bar shape. Either way, the interposer terminals 501-510 provide conductive paths between pads 596, 597 through vias 595. To incorporate the interposer 500, 520 into a module (e.g., module 200, FIG. 2), the conductive pads 597 on the bottom surface 594 may be soldered or otherwise attached to one or more conductive pads (e.g., pads 312, 361, 362, 369, FIG. 3) on the surface of a module substrate, and those pads may be electrically coupled to a signal layer (e.g., layer 301, FIG. 3), to a ground layer (e.g., layer 302 and/or 304, FIG. 3), to a layer configured to convey bias voltages (e.g., layer 303, FIG. 3), or in the case of "dummy" pads, may be left electrically floating. Essentially, interposers 500, 520 may be utilized for any of the terminal interposers 241-246 of FIG. 2.

When each via 595 has a square or circular cross-section, the via 595 may have a width 586 (or diameter) in a range of about 300 microns to about 800 microns (e.g., about 500 microns), although the width 586 may be smaller or larger, as well. According to an embodiment, a portion of the overall lengths 581 and widths 582, 583 of the interposers 500, 520 that is occupied by each terminal 501-510 is in a range of about 500 microns to about 2000 microns, so that the overall lengths 581 of the interposers 500, 520 are in a range of about 2500 microns to about 10,000 microns, the width 582 of the single-row interposer 500 is in a range of about 500 microns to about 2000 microns, and the width 583 of the double-row interposer 520 is in a range of about 1000 microns to about 4000 microns. As can be most clearly seen with reference to FIG. 2, in some embodiments, the lengths 581 of the interposers 500, 520 may be significantly shorter than (e.g., half or a quarter or less) the length of a side of a module substrate (e.g., module substrate 210) to which the interposer is adjacent, although the length of an interposer may be as long as the length of the side of a module substrate, in other embodiments. In still other embodiments, each terminal 501-510 may occupy a smaller or larger portion of the interposer 500, 520 in which it is embedded. The height 585 of the interposers 500, 520 (and thus the combined height of via 595 and pads 596, 597) may be in a range of about 500 microns to about 1500 microns (e.g., about 1000 microns), for example, although each interposer 500, 520 may be shorter or taller, as well.

As mentioned previously, when the interposer 500, 520 is incorporated into a module (e.g., module 200, FIG. 2), the height 585 of the interposer 500, 520 may be approximately equal to the thickness (e.g., thickness 384, FIG. 3) of the encapsulant material (e.g., encapsulant material 380), so that the top conductive pad 596 of each interposer terminal 501-510 may be substantially co-planar with the contact surface (e.g., surface 382, FIG. 3) of the module. In other embodiments, the top conductive pad 596 of each interposer terminal may be recessed below or extend above the contact surface of the module.

FIGS. 6A and 6B are top and side views of a terminal interposer 600, in accordance with yet another example embodiment. Terminal interposer 600 essentially includes two instances of terminal interposer 500 (FIG. 5A) in a stacked configuration, with an intermediate patterned conductive layer 606. As best shown in the side, cross-sectional view of FIG. 6B, interposer 600 includes first and second dielectric bodies 692-1, 692-2 (e.g., formed from FR-4, ceramic, or other suitable dielectric materials) stacked together with patterned conductive layer 606 between the two dielectric bodies 692-1, 692-2. The top surface 693 of dielectric body 692-1 defines the top surface of the interposer 600, and the bottom surface 694 of dielectric body 692-2 defines the bottom surface of the interposer 600.

Terminals 601-605 are embedded within the dielectric bodies 692-1, 692-2. Each interposer terminal 601-605 includes a first conductive via 695-1 extending through the dielectric body 692-1, and a second conductive via 695-2 extending through the dielectric body 692-2. Conductive traces 611-615 formed from portions of patterned conductive layer 606 serve to electrically connect the stacked vias of each terminal 601-605. In addition, the conductive traces 611-615 may extend to either or both sides 698, 699 of the dielectric bodies 692-1, 692-2, as shown in FIG. 6A, and exposed ends of the traces 611-615 at the side(s) 698, 699 may serve as additional connections to the terminals 601-605.

In addition, conductive pads 696, 697 are deposited on the top and bottom surfaces 693, 694 of the interposer 600 in contact with first and second ends (or proximal and distal ends), respectively, of each set of stacked conductive vias 695-1, 695-2. As indicated in FIG. 6A, each conductive via 695-1, 695-2 may have a circular cross-sectional shape. However, in other embodiments, each conductive via 695-1, 695-2 alternatively may have a square, rectangular, or bar shape. Either way, the interposer terminals 601-605 provide conductive paths between pads 696, 697 through vias 695-1, 695-2, and as mentioned above, include additional connections to the terminals 601-605 through the exposed ends of conductive traces 611-615.

To incorporate the interposer 600 into a module (e.g., module 200, FIG. 2), the conductive pads 697 on the bottom surface 694 may be soldered or otherwise attached to one or more conductive pads (e.g., pads 312, 361, 362, 369, FIG. 3) on the surface of a module substrate, and those pads may be electrically coupled to a signal layer (e.g., layer 301, FIG. 3), to a ground layer (e.g., layer 302 and/or 304, FIG. 3), to a layer configured to convey bias voltages (e.g., layer 303, FIG. 3), or in the case of "dummy" pads, may be left electrically floating. Essentially, interposers 600 may be utilized for any of the terminal interposers 241-246 of FIG. 2. Further, the interposer and via dimensions may be substantially the same as those discussed in conjunction with interposer 520 (FIG. 5B). Although interposer 600 is shown to include five terminals 601-605, in other embodiments, the interposer 600 may include more or fewer terminals.

FIGS. 7A and 7B are top and side views of a shield/ground interposer 700 (e.g., interposer 247, FIG. 2), in accordance with an example embodiment. Shield/ground interposer 700 is similar to the double-row interposer 520 of FIG. 5B, except that the rows 771, 773 of terminals 701-710 within interposer 700 are offset from each other. Accordingly, as best depicted in the side view of FIG. 7B, the combination of terminals 701-710 forms a continuous or substantially continuous "wall" of electrically-conductive material, which functions to capture and shunt electromagnetic energy produced by nearby electrical components (e.g., the driver- and/or final-stage dies 233, 234, 253, 254, FIG. 2, and/or wirebonds or other conductors coupled to those dies) to ground.

Once again, interposer 700 includes a dielectric body 792 (e.g., formed from FR-4, ceramic, or other suitable dielectric materials) with top and bottom surfaces 793, 794, and the terminals 701-710 are embedded within the dielectric body 792. Each interposer terminal 701-710 includes a conductive via 795 extending through the dielectric body 792 between its top and bottom surfaces 793, 794. In addition, conductive pads 796, 797 are deposited on the top and bottom surfaces 793, 794 in contact with first and second ends (or proximal and distal ends), respectively, of each conductive via 795. To incorporate the interposer 700 into a module (e.g., module 200, FIG. 2), the conductive pads 797 on the bottom surface 794 may be soldered or otherwise attached to one or more ground pads (e.g., pads 348, FIG. 3) on the surface of the module substrate, and those pads may be electrically coupled to a ground layer (e.g., layer 302 and/or 304, FIG. 3).

As indicated in FIG. 7A, each conductive via 795 may have a circular cross-sectional shape. However, in other embodiments, each conductive via 795 alternatively may have a square, rectangular, or bar shape. Either way, the interposer terminals 701-710 provide conductive paths between pads 796, 797 through vias 795. The interposer and via dimensions may be substantially the same as those discussed in conjunction with interposer 520 (FIG. 5B). Further, although each row 771, 773 of interposer terminals in FIGS. 7A and 7B includes five terminals, in other embodiments, a row of interposer terminals may include more or fewer terminals. In addition, a shield/ground interposer may include more than two rows of terminals, in still other embodiments.

FIG. 7 depicts a shield/ground interposer 700 that forms an electrically conductive "wall" with a plurality of conductive terminals 701-710. Other embodiments of a shield/ground interposer may have any of a number of alternate configurations. For example, FIG. 8 is a perspective view of a shield/ground interposer 800, in accordance with another example embodiment. Shield/ground interposer 800 includes a dielectric body 892 (e.g., formed from FR-4, ceramic, or other suitable dielectric materials) with top, bottom, and side surfaces 893, 894, 895. In addition, a conductive layer 896 is disposed (e.g., sputtered or otherwise attached) to at least one of the side surfaces 895. The conductive layer 896 may be considered a "terminal", in the same sense that a conductive via and its associated pads may be considered a terminal (e.g., the conductive layer 896 enables current to flow between the top and bottom surfaces of the interposer 700). Further conductive layers 897, 898 may be disposed on the top and bottom surfaces 893, 894 of the dielectric body 892 to facilitate attachment to a module substrate (e.g., module substrate 210, FIG. 2). For example, to incorporate the interposer 800 in a module (e.g., module 200, FIG. 2), the conductive layer 898 on the bottom surface 894 may be soldered or otherwise attached to one or more conductive ground pads (e.g., pads 348, FIG. 3) on the surface of the module substrate, and those pads may be electrically coupled to a ground layer (e.g., layer 302 and/or 304, FIG. 3). Desirably, the shield/ground interposer 800 would be positioned at a location (e.g., the same location as interposer 247, FIG. 2), so that the shield/ground interposer 800 may function to capture and shunt electromagnetic energy produced by nearby electrical components (e.g., the driver- and/or final-stage dies 233, 234, 253, 254, FIG. 2, and/or wirebonds or other conductors coupled to those dies) to ground. The interposer dimensions may be substantially the same as those discussed in conjunction with interposer 520 (FIG. 5B).

FIG. 9A is a top view of a shield/ground interposer 900, in accordance with yet another example embodiment, and FIG. 9B is a side, cross-sectional view of interposer 900 along line 9-9 of FIG. 9A. Shield/ground interposer 900 includes a dielectric body 992 (e.g., formed from FR-4, ceramic, or other suitable dielectric materials) with top and bottom surfaces 993, 994, and an interposer terminal 901 embedded within the dielectric body 992. Terminal 901 includes a conductive via 995 extending through the dielectric body 992 between its top and bottom surfaces 993, 994. According to an embodiment, and as best viewed in FIG. 9A, the via 995 has an elongated "trench" shape (i.e., a shape in which the length of the via is substantially greater than the width of the via), which may extend nearly the entire length 981 of the interposer 900. In addition, conductive pads 996, 997 are deposited on the top and bottom surfaces 993, 994 in contact with first and second ends (or proximal and distal ends), respectively, of the conductive via 995. To incorporate the interposer 900 into a module (e.g., module 200, FIG. 2), the conductive pad 997 on the bottom surface 994 may be soldered or otherwise attached to one or more ground pads (e.g., pads 348, FIG. 3) on the surface of the module substrate, and those pads may be electrically coupled to a ground layer (e.g., layer 302 and/or 304, FIG. 3). Desirably, the shield/ground interposer 900 would be positioned at a location (e.g., the same location as interposer 247, FIG. 2). As best viewed in FIG. 9B, the trench via 995 forms an electrically conductive "wall", which may function to capture and shunt electromagnetic energy produced by nearby electrical components (e.g., the driver- and/or final-stage dies 233, 234, 253, 254, FIG. 2, and/or wirebonds or other conductors coupled to those dies) to ground. The interposer dimensions may be substantially the same as those discussed in conjunction with interposer 520 (FIG. 5B).

As indicated previously, to incorporate embodiments of power amplifier module 200 into a larger electrical system (e.g., a final stage amplifier of a cellular base station), one surface of the power amplifier module 200 is physically and electrically coupled to a system substrate, and a heat sink is attached to the opposite surface of the power amplifier module 200. To illustrate the integration of power amplifier module 200 into such a system, reference is now made to FIG. 10, which is a cross-sectional, side view of an amplifier system 1000 that includes the power amplifier module 200 of FIG. 2 coupled to a system substrate 1010 and a heat sink 1016, in accordance with an example embodiment.

The RF system 1000 generally includes a system substrate 1010, power amplifier module 200, and a heat sink 1016. According to an embodiment, the system substrate 1010 includes a multi-layer printed circuit board (PCB) or other suitable substrate. The system substrate 1010 has a top surface 1009 (also referred to as a "mounting surface"), an opposed bottom surface 1011. The system substrate 1010 also includes a plurality of dielectric layers 1005, 1006, 1007 (e.g., formed from FR-4, ceramic, or other PCB dielectric materials), in an alternating arrangement with a plurality of conductive layers 1001, 1002, 1003, where the top surface 1009 of the system substrate 1010 is defined by a patterned conductive layer 1001. It should be noted that, although system substrate 1010 is shown to include three dielectric layers 1005-1007 and three conductive layers 1001-1003, other embodiments of a system substrate may include more or fewer dielectric layers and/or conductive layers.

Each of the various conductive layers 1001-1003 may have a primary purpose, and also may include conductive features that facilitate signal and/or voltage/ground routing between other layers. Although the description below indicates a primary purpose for each of the conductive layers 1001-1003, it should be understood that the layers (or their functionality) may be arranged differently from the particular arrangement best illustrated in FIG. 10 and discussed below.

For example, in an embodiment, the patterned conductive layer 1001 at the mounting surface 1009 of the system substrate 1010 may primarily function as a signal conducting layer. More specifically, layer 1001 includes a plurality of conductive features (e.g., conductive pads and traces) which serve as attachment points for module 200, an input RF connector 1091, and an output RF connector 1092. Each of RF connectors 1091, 1092 may, for example, be coaxial connectors with a central signal conductor 1093 and an outer ground shield 1094. According to an embodiment, the signal conductor 1093 of RF input connector 1091 is electrically coupled to a first conductive trace 1012 of layer 1001, which in turn is coupled to input terminal 212 of module 200, as described in more detail below. In addition, the signal conductor 1093 of RF output connector 1092 is electrically coupled to a second conductive trace 1014 of layer 1001, which in turn is coupled to an output terminal (e.g., terminal 214, FIG. 2) of module 200. The ground shields 1094 of connectors 1091, 1092 are electrically coupled to additional traces (not numbered), which in turn are electrically coupled to a system ground layer 1002 of the system substrate 1010 through conductive vias 1095 that extend between layers 1001 and 1002.

As just indicated, conductive layer 1002 functions as a system ground layer. In addition to being electrically coupled to the ground shields 1094 of connectors 1091, 1092, the system ground layer 1002 also is electrically coupled through additional conductive vias 1096 to additional ground pads 1041 on the mounting surface 1009. The additional ground pads 1041 are physically and electrically coupled to the various ground terminals (e.g., terminals 248, 261, 262, 265, 266) and, in some embodiments, to any "dummy" terminals (e.g., terminal 269) of module 200.

Module 200 is coupled to the mounting surface 1009 of system substrate 1010 in an inverted (or "flipped") orientation from the orientation depicted in FIG. 3. More specifically, module 200 is coupled to the system substrate 1010 so that the contact surface 382 of the module 200 and the mounting surface 1009 of the system substrate 1010 face each other. In order to connect module 200 to system substrate 1010, each of the terminals of module 200 (e.g., terminals 212, 214, 248, 261, 262, 265, 266, 267-1, 267-, 267-3, 268-1, 268-2, 268-3, 269, FIG. 2) are aligned and brought into contact with corresponding pads (e.g., pads 1014, 1041) on the mounting surface 1009 of system substrate 1010. In embodiments in which conductive attachment material 383 is disposed on the exposed ends of the module terminals, the conductive attachment material 383 is reflowed or otherwise cured to physically connect the module terminals to their corresponding pads on the mounting surface 1009 of the module substrate 1010. In other embodiments, conductive attachment material also or alternatively may be disposed on the conductive pads (e.g., pads 1014, 1041) of the system substrate 1010, and an appropriate reflow or curing process may be performed to connect the module 200 to the system substrate 1010.

According to an embodiment, a heat sink 1016 is physically and thermally coupled to the heat sink attachment surface 211 of the power amplifier module 200, and more specifically to conductive layer 304 and/or the surface(s) 318 of the embedded heat dissipation structure(s) 316 of module 200. The heat sink 1016 is formed from a thermally-conductive material, which also may be electrically-conductive. For example, the heat sink 1016 may be formed from copper or another bulk conductive material. To couple the heat sink 1016 to the power amplifier module 200, a thermally conductive material 1098 (e.g., thermal grease) may be dispensed on the heat sink attachment surface 211 of the module 200 (and/or on the surface(s) 318 of the heat dissipation structure(s) 316) and/or the heat sink 1016, and the heat sink 1016 may be brought into contact with the heat sink attachment surface 211. The heat sink 1016 may then be clamped, screwed, or otherwise secured in place.

During operation of RF system 1000, input RF signals are provided through the RF input terminal 1091 and trace/pad 1012 to an RF input terminal 212 at the contact surface 382 of the power amplifier module 200. The input RF signals are conveyed through terminal 212 and additional components (e.g., power splitter 220, FIG. 2) to the power transistor dies 233, 234, 253, 254, which amplify the input RF signal as discussed previously. The amplified output RF signals are produced at output terminal 214 (FIG. 2), which is electrically coupled to trace/pad 1014, and to the RF output terminal 1092.

According to an embodiment, a ground path is provided between each of the power transistor dies 233, 234, 253, 254 (FIG. 2, hidden in FIG. 10) and the system ground layer 1002. For example, the ground path for each die 233, 234, 253, 254 includes a first conductive ground path through the module 200, which extends from the ground contact for the die (e.g., the bottom-side source contact) through a portion of a thermal dissipation structure 316, the RF ground layer 302 of the module substrate 210, any intervening vias, a ground terminal pad at the mounting surface 209, and one or more ground terminals (e.g., terminal 248 in interposer 247, FIG. 2). The ground path continues into the system substrate 1010, and more particularly through one or more ground pads 1041 on the mounting surface 1009 of the system substrate 1010 and one or more ground vias 1096 to the system ground layer 1002.

As discussed in detail previously, the ground terminals 248 in the ground/shield interposer 247 of the module 200 may be placed in close proximity to the power transistor dies 233, 234, 253, 254 (e.g., between the dies 233, 234 of the carrier path and the dies 253, 254 of the peaking path), which results in a relatively short ground return path for the module 200. Desirably, the entire electrical length of the ground path between the ground contact for each die 233, 234, 253, 254 and the system ground layer 1002 is less than about lambda/5 ($\lambda/5$), in some embodiments, or less than about lambda/16 ($\lambda/16$), in other embodiments.

During operation, significant thermal energy (heat) may be produced by the power transistor(s) within the power transistor dies 233, 234, 253, 254. As indicated by arrows 1099, the thermal energy produced by the power transistor(s) is conveyed through the thermal dissipation structure(s) 316 to the heat sink 1016, which effectively dissipates the heat to the ambient atmosphere. Accordingly, the thermal dissipation structure(s) 316 provide two functions: 1) the function of conveying heat produced by the power transistor dies 233, 234, 253, 254 to the heat sink 1016; and 2) the function of electrically coupling the ground contacts of the dies 233, 234, 253, 254 to system ground.

Figure 10:
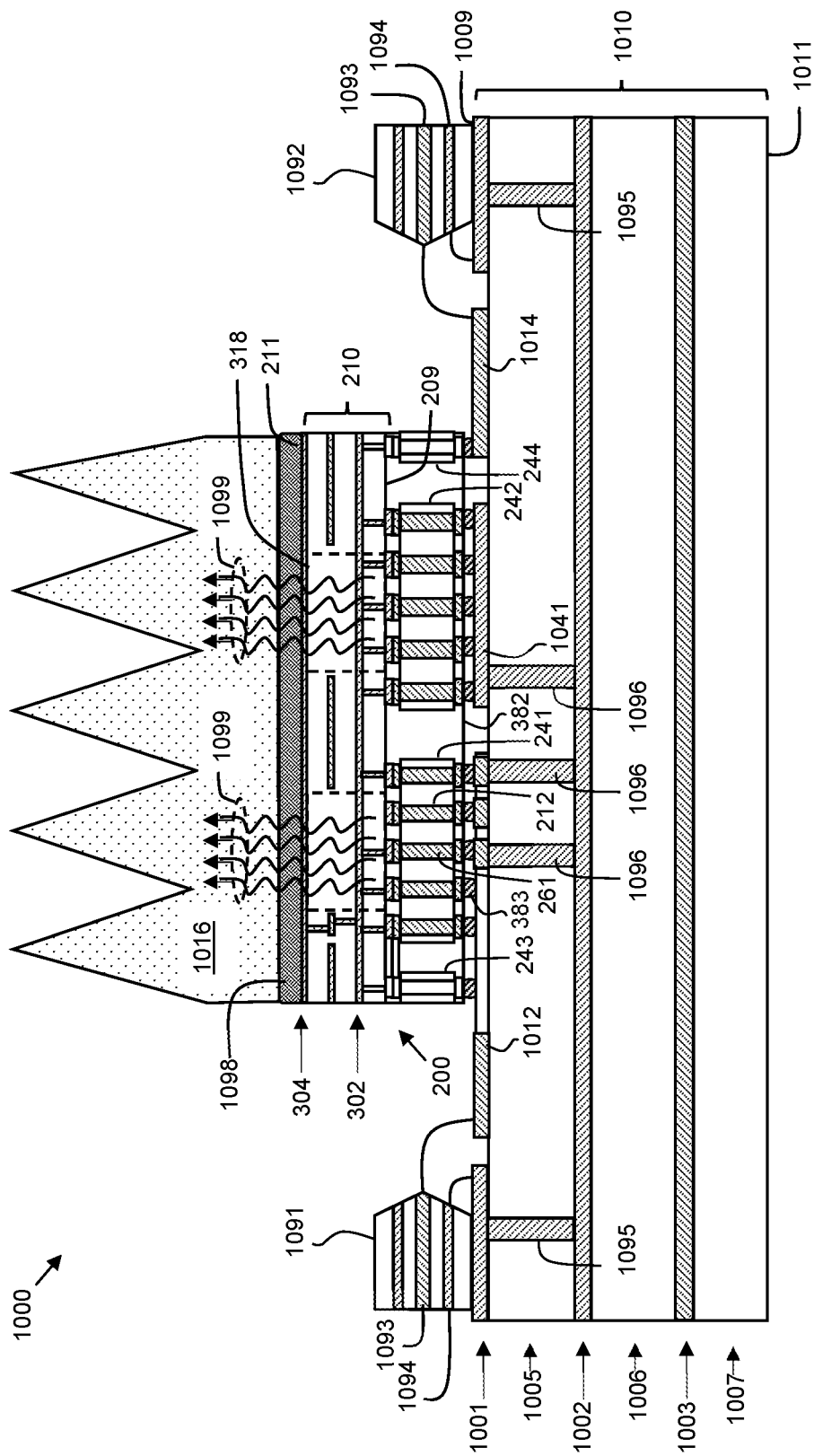
FIG. 10 is a cross-sectional, side view of an amplifier system that includes the power amplifier module of FIG. 2 coupled to a system substrate and a heat sink, in accordance with an example embodiment.
Figure 11:
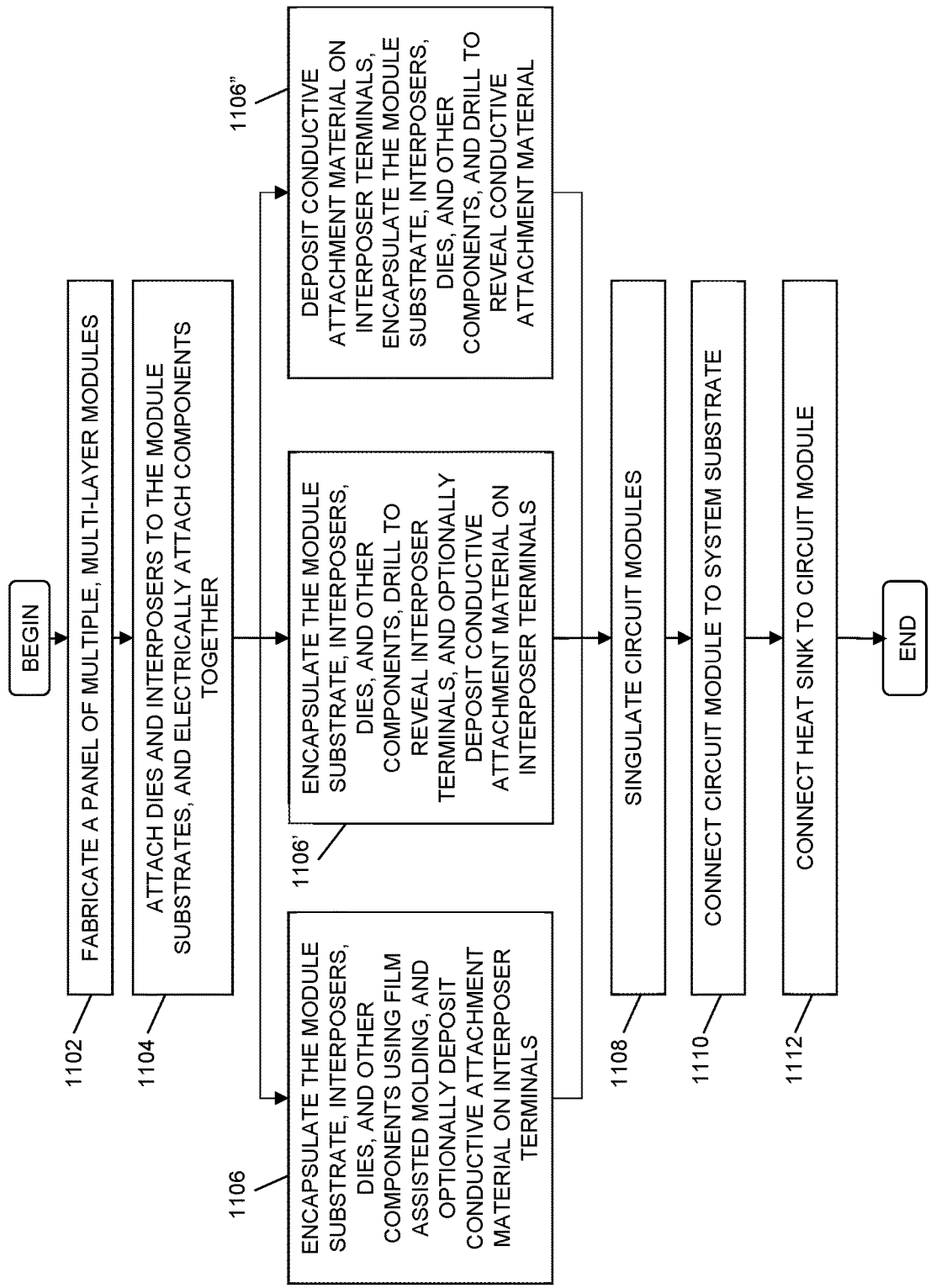
FIG. 11 is a flowchart of a method for fabricating a power amplifier module and an amplifier system, in accordance with an example embodiment.

FIG. 11 is a flowchart of a method of fabricating a power amplifier module (e.g., power amplifier module 200, FIG. 2) and assembling the power amplifier module into an RF system (e.g., RF system 1000, FIG. 10). According to an example embodiment, the power amplifier module is fabricated in the context of a strip or panel of (typically) identical modules, which are singulated at a later fabrication step. To illustrate the parallel fabrication process, FIGS. 12-19 depict a panel 1200 of four modules 1201-1204 (delineated with dashed-lines) at various points in the fabrication process, although those of skill in the art would understand, based on the description herein, that a strip or panel of parallel-fabricated modules typically would include substantially more than four modules. An assumption is made that the panel 1300 would include additional modules (not illustrated) surrounding modules 1201-1204. In addition, as will be explained in more detail in conjunction with FIG. 13, in order to convey the details of multiple different embodiments concisely, different embodiments of terminal interposers (e.g., interposers 1341, 1342, FIG. 13) are shown to be coupled to various ones of the four, parallel-fabricated modules. In an actual fabrication process, it may be desirable to utilize identical terminal interposers in order to produce identical modules in a cost-effective manner.

Figure 12:
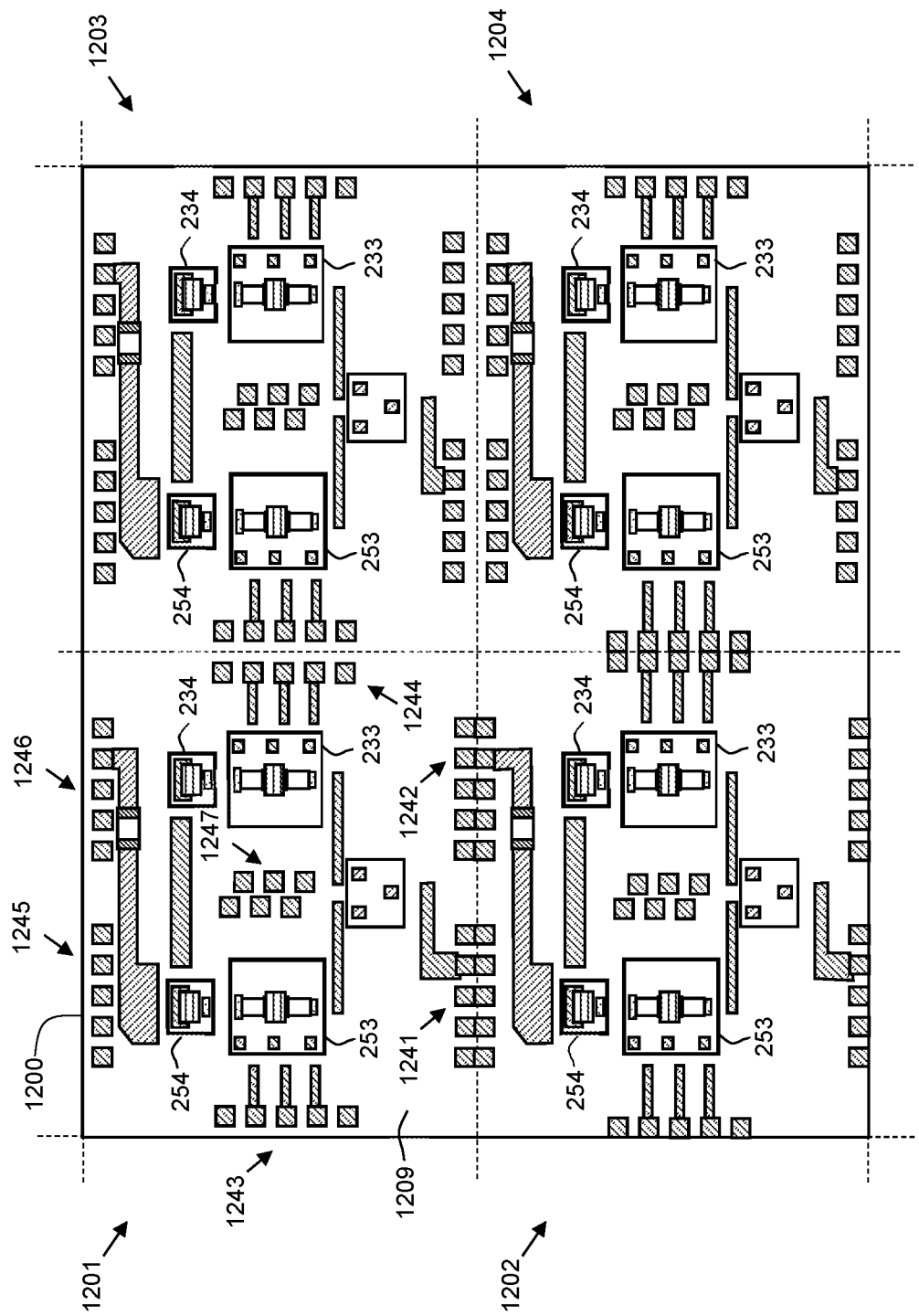
FIG. 12 is a top view of a panel of module substrates at a first stage of manufacture, in accordance with an example embodiment.

Starting first with step 1102 and referring to the top view of FIG. 12, the method may begin by fabricating a panel 1200 of multiple, multi-layer module substrates 1201, 1202, 1203, 1204 (e.g., multiple instances of module substrate 210, FIGS. 2, 3) and attaching various dies thereto. As discussed previously, formation of the module substrates 1201-1204 may include producing a multi-layer PCB, where a top patterned conductive layer (e.g., layer 301, FIG. 3) at a mounting surface 1209 (e.g., surface 209, FIG. 3) includes a plurality of conductive pads and traces that are positioned according to the circuits that are to be housed by the modules. As discussed previously, some of the pads correspond to signal, ground, bias, or dummy pads to which interposers will be connected (e.g., interposer pads 1241-1247). In addition, each module 1201-1204 may include a plurality of thermal dissipation structures (e.g., thermal dissipation structures 316, FIGS. 2, 3, including conductive coins and/or thermal vias). To prepare for attachment of the various circuit components and interposers, a solder print process may be performed in which solder (or solder paste, conductive adhesive or other conductive attachment material) is deposited on those conductive pads to which corresponding leads, pads, or terminals of the various circuit components and interposers will be attached. Step 1102 also includes attaching various discrete components to the prepared conductive pads. For example, a component placement process and machinery (e.g., pick and placement machinery, such as a chip shooter or flexible placer) may be utilized to rapidly place various discrete components (e.g., capacitors, resistors, etc.) in their appropriate locations on the modules 1201-1204.

In step 1104, a die attach/bonding process may be used to place and attach the power transistor dies 233, 234, 253, 254 in their appropriate locations on the modules 1201-1204. For example, the power transistor dies 233, 234, 253, 254 may be attached to the exposed, top surfaces of thermal dissipation structures (e.g., e.g., thermal dissipation structures 316, FIGS. 2, 3, including conductive coins and/or thermal vias) using solder, sintering, conductive adhesive, or other attachment means.

Figure 13:
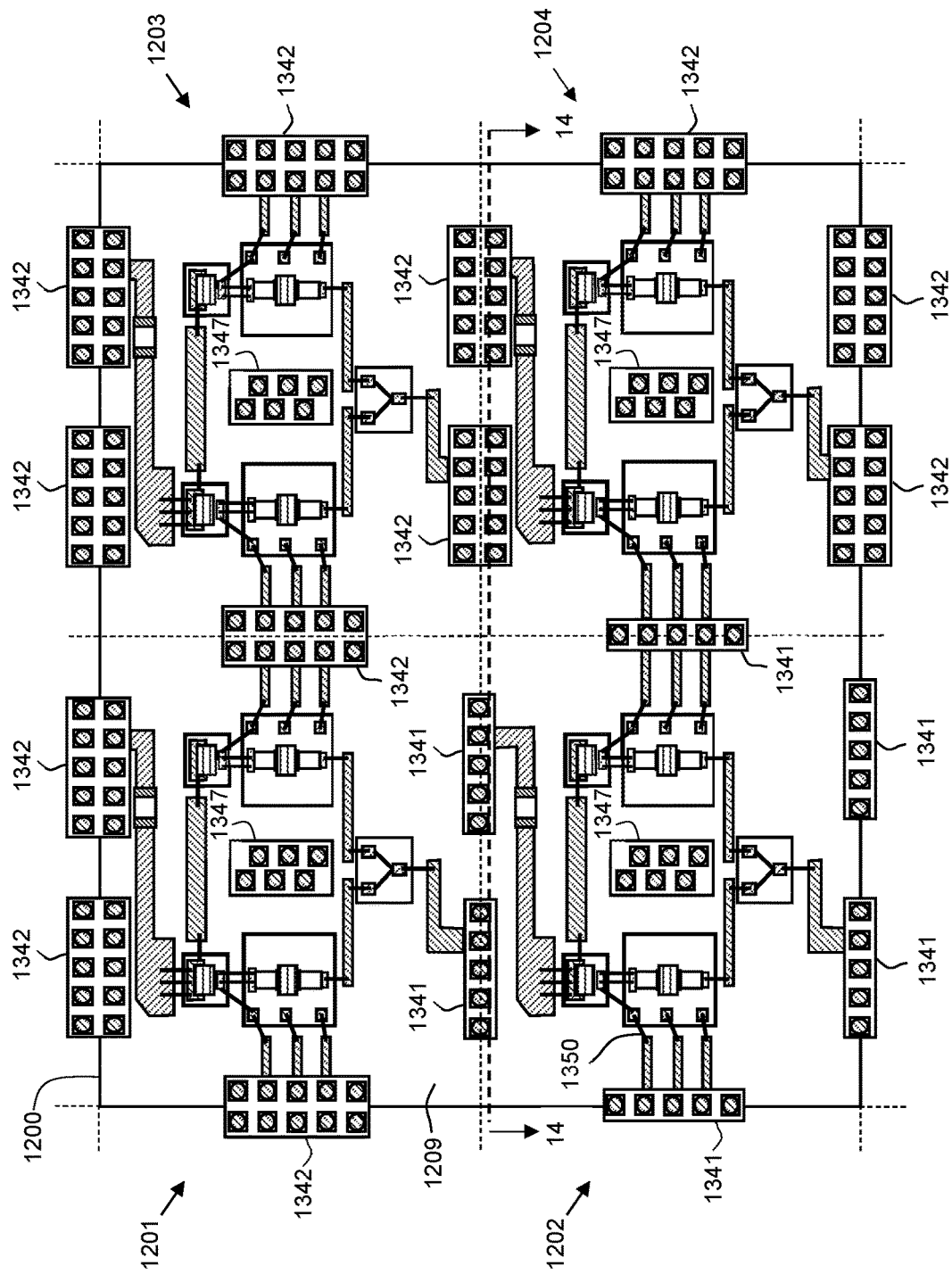
FIG. 13 is a top view of the panel of module substrates of FIG. 12 at a second stage of manufacture, in accordance with an example embodiment.

Referring now to FIG. 13, which illustrates a top view of panel 1200 at a subsequent fabrication step, a plurality of terminal and shield/ground interposers 1341, 1342, 1347 are then attached, using a die attach/bonding process, to the interposer pads 1241-1247 (FIG. 12) on the mounting surface 1209 of the panel 1200. According to various embodiments, and as discussed above in conjunction with FIGS. 5A-C, the terminal interposers 1341 (e.g., interposer 500, FIG. 5A) may include a single row of terminals (e.g., terminals 501-505, FIG. 5A), and/or the terminal interposers 1342 (e.g., interposer 520, FIG. 5B) may include two rows of terminals (e.g., terminals 501-510, FIG. 5B). A mentioned previously, it may be desirable to have all of the terminal interposers be identical. However, to convey the details of multiple different embodiments concisely, both single-row and double-row terminal interposers 1341, 1342 are shown in FIG. 13. The single-row terminal interposers 1341 are more specifically attached to module 1202 and to the adjacent interposer pads of adjacent modules 1201, 1204, and the double-row terminal interposers 1342 are attached to modules 1201, 1203, and 1204. As can be seen at the exterior edges of modules 1201-1204, the terminal interposers 1341, 1342 span across the boundaries of adjacent modules 1201-1204 (and modules, not illustrated, surrounding modules 1201-1204). Accordingly, for the double-row terminal interposers 1341, one row of an interposer 1341 overlies and connects with the interposer pads for one module (e.g., module 1201), and the other row of the same interposer 1341 overlies and connects with the interposer pads for an adjacent module (e.g., module 1203). Conversely, for the single-row interposers 1342, the interposer terminals are bisected by the edges (e.g., delineated by the dashed lines) of adjacent modules. Accordingly, for the single-row terminal interposers 1342, half of each interposer terminal overlies and connects with an interposer pad for one module (e.g., module 1202), and the other half of each interposer terminal overlies and connects with an interposer pad for an adjacent module (e.g., module 1204).

The shield/ground interposers 1347 are coupled to interposer pads between dies 233/234 and 253/254 (or between the carrier and peaking paths). In various embodiments, the shield/ground interposers 1347 may have a configuration similar to shield/ground interposer 700 (FIG. 7A, 7B), as shown in FIG. 13, or the shield/ground interposers 1347 may have configurations similar to shield/ground interposers 800, 900 (FIGS. 8, 9A, 9B).

Step 1104 also includes electrically attaching the components and dies together and to conductive pads and traces of the top patterned conductive layer. For example, the electrical attachments may be made using wirebonds (e.g., wirebond 1350). Finally, the various components, dies, and interposers are secured to the panel 1200 by heating the panel 1200 in a reflow oven for a period of time sufficient to reflow solder or solder paste previously applied to the substrate pads, die and component pads and terminals, and interposer pads, and thus to secure the various dies, components, and interposers to the panel 1200. The panel 1200 may then be defluxed and otherwise cleaned to prepare the panel 1200 for the next fabrication phase.

After attachment of the various dies, components, interposers, and electrical connections, encapsulant material (e.g., encapsulant material 380, FIG. 3) is applied over the mounting surface 1209 of the panel 1200, and fabrication of the panel 1200 is completed. Any one of several methods may be performed to apply the encapsulant material and complete the panel 1200, and three such methods are specified with parallel steps 1106, 1106', and 1106" in FIG. 11.

Starting with a first embodiment, as depicted in step 1106 and illustrated in FIGS. 14A and 14B, a film assisted molding (FAM) process is performed to apply the encapsulant material. Referring to FIG. 14A, which is a side, cross-sectional view of panel 1200 along line 14-14 (FIG. 13), the FAM process includes placing a film 1402 (e.g., QFN film) over the mounting surface 1209 of the panel 1200 so that an adhesive side of the film 1402 contacts and protects the distal ends of the interposer terminals (e.g., terminals 212, 214, 248, 261, 262, 265, 266, 269). During the FAM process, the interposers 1341, 1342, 1347 function to support the film 1402 above the mounting surface 1209 of the panel 1200. Viscous encapsulant material 380 is then flowed onto the mounting surface 1209 below the film 1402, and after curing the encapsulant material 380 and removing the film 1402, the result is a panel 1410 of encapsulated modules, as shown in FIG. 14B. Optionally, conductive attachment material 383 (e.g., solder, solder paste or conductive adhesive) may then be deposited on the exposed, distal ends of the terminals to prepare each module for subsequent attachment to a system substrate (e.g., substrate 1010, FIG. 10). Alternatively, the conductive attachment material 383 may be applied during a later step (e.g., step 1110, described below).

Figure 15A:
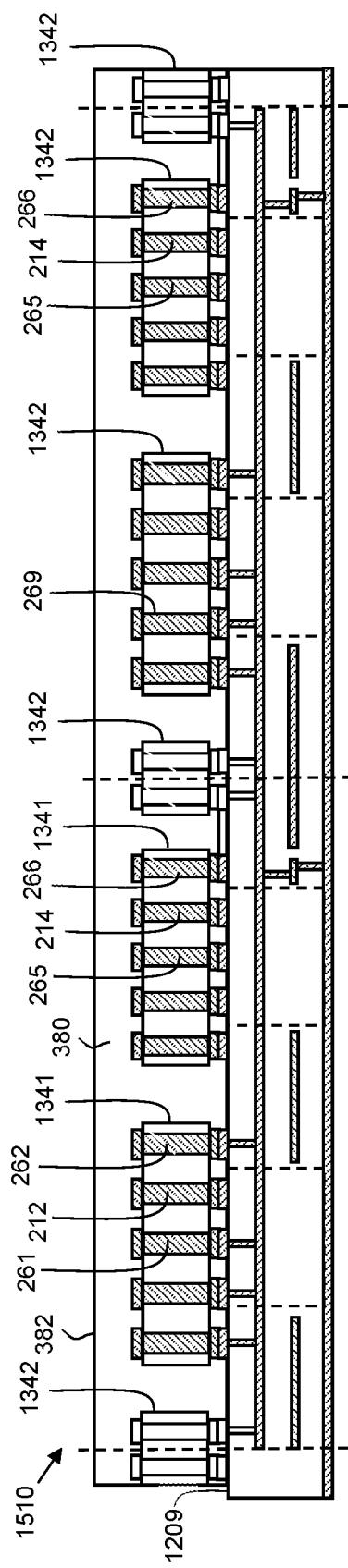
FIGS. 15A, 15B, and 15C are side views of the panel of module substrates of FIG. 13 at third, fourth, and fifth stages of manufacture, in accordance with another example embodiment.
Figure 15B:
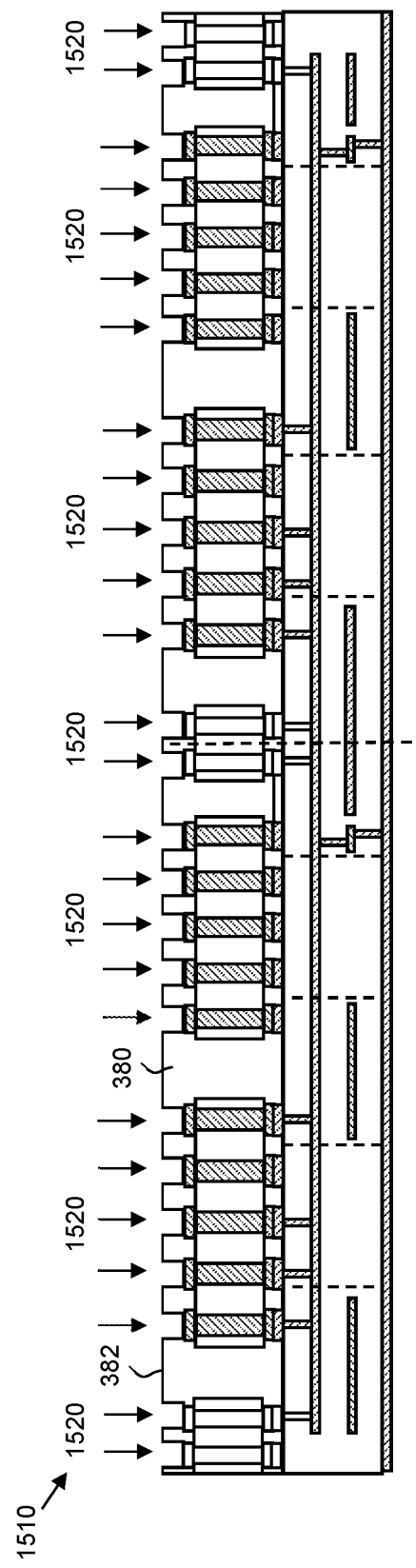
Figure 15C:
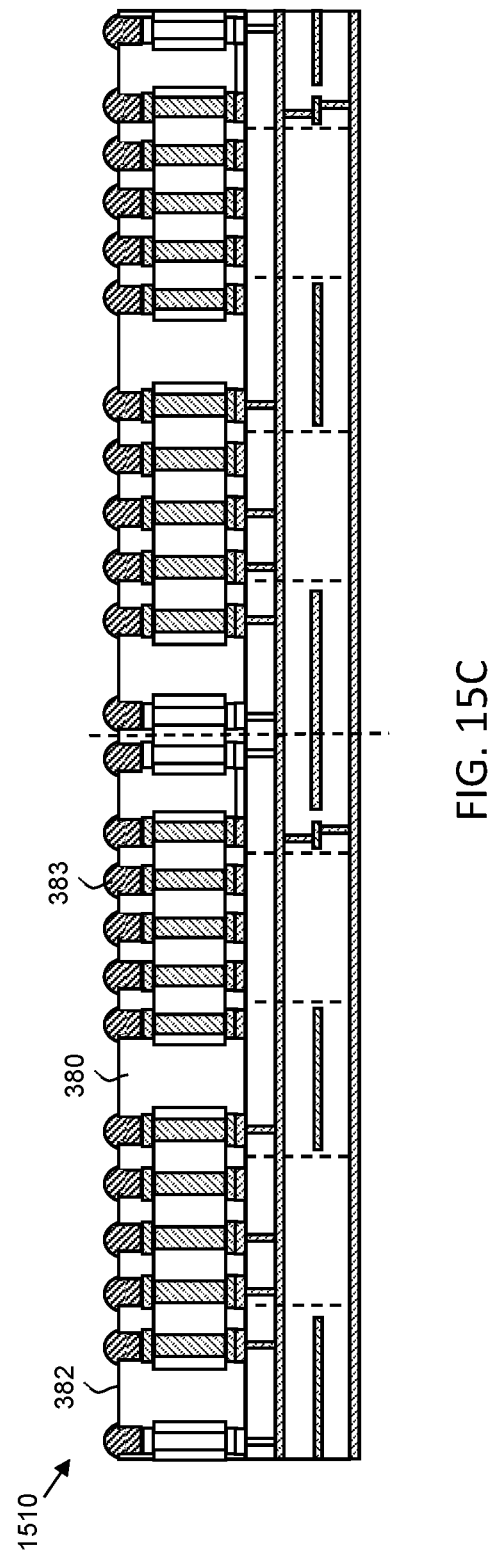

In a second embodiment, as depicted in step 1106' and illustrated in FIGS. 15A-C, an overmolding and encapsulant drilling process is performed to apply the encapsulant material and to expose the terminals. Referring to FIG. 15A, which is another side, cross-sectional view of panel 1200 along line 14-14 (FIG. 13), the overmolding process includes applying viscous encapsulant material 380 onto the mounting surface 1209 so that the encapsulant material 380 entirely covers the mounting surface 1209, the components and dies, and the interposers 1341, 1342, and extends some distance above the top surfaces of the interposers 1341, 1342. This results in a panel 1510 of encapsulated modules. After curing the encapsulant material 380, and referring to FIG. 15B, a plurality of openings 1520 are formed through the top surface 382 of the encapsulant material 380 to expose the distal ends of the terminals (e.g., terminals 212, 214, 248, 261, 262, 265, 266, 269). For example, the openings may be formed using a laser ablation process (e.g., using a long pulse laser), using a mechanical drilling process, or using another suitable process. Referring now to FIG. 15C, conductive attachment material 383 (e.g., solder, solder paste or conductive adhesive) may then be deposited into the openings 1520 and onto the exposed, distal ends of the terminals to prepare each module for subsequent attachment to a system substrate (e.g., substrate 1010, FIG. 10). Alternatively, the conductive attachment material 383 may be applied during a later step (e.g., step 1110, described below).

Figure 16A:
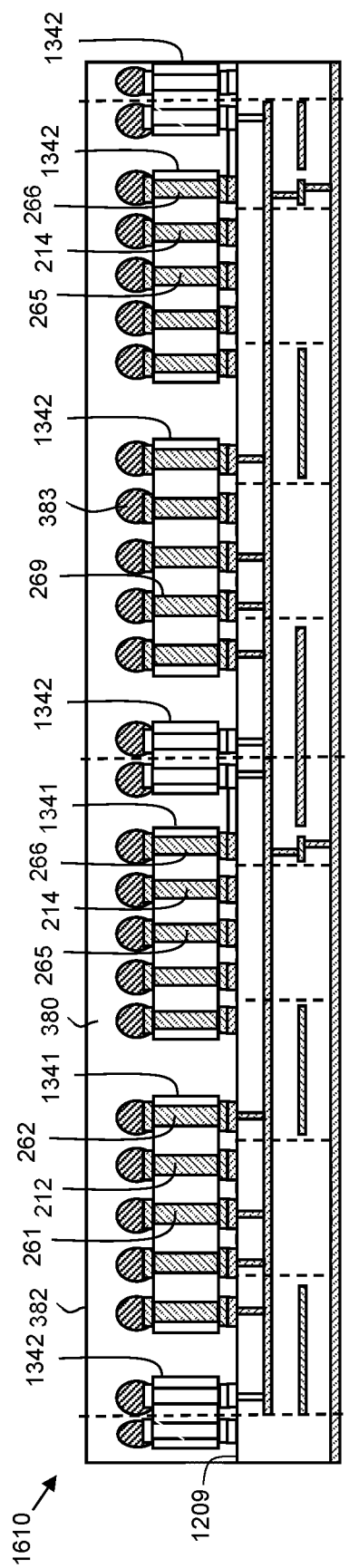
FIGS. 16A and 16B are side views of the panel of module substrates of FIG. 13 at third, fourth, and fifth stages of manufacture, in accordance with yet another example embodiment.
Figure 16B:
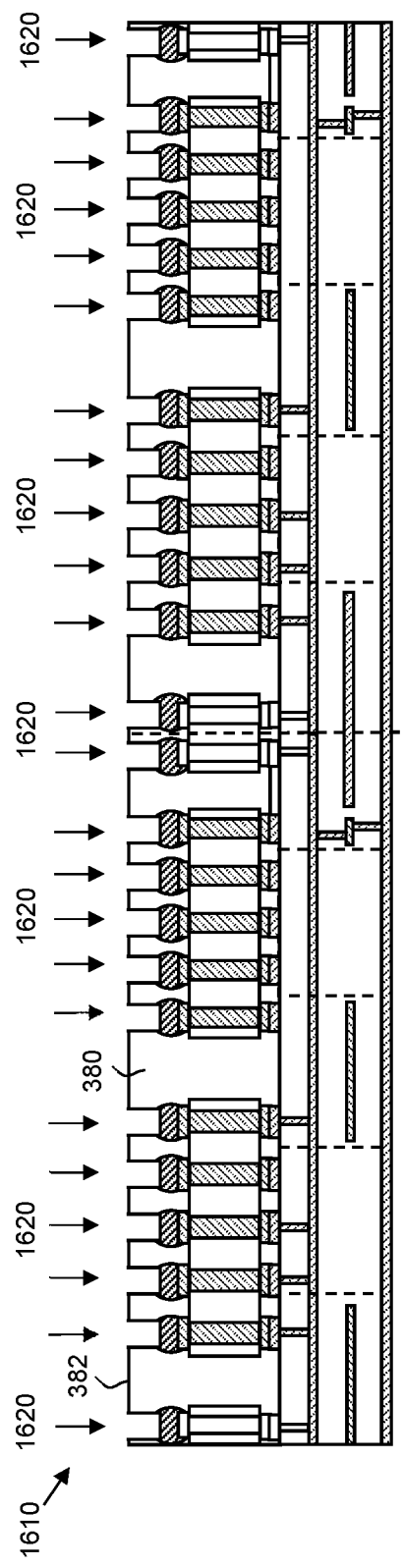
Figure 17:
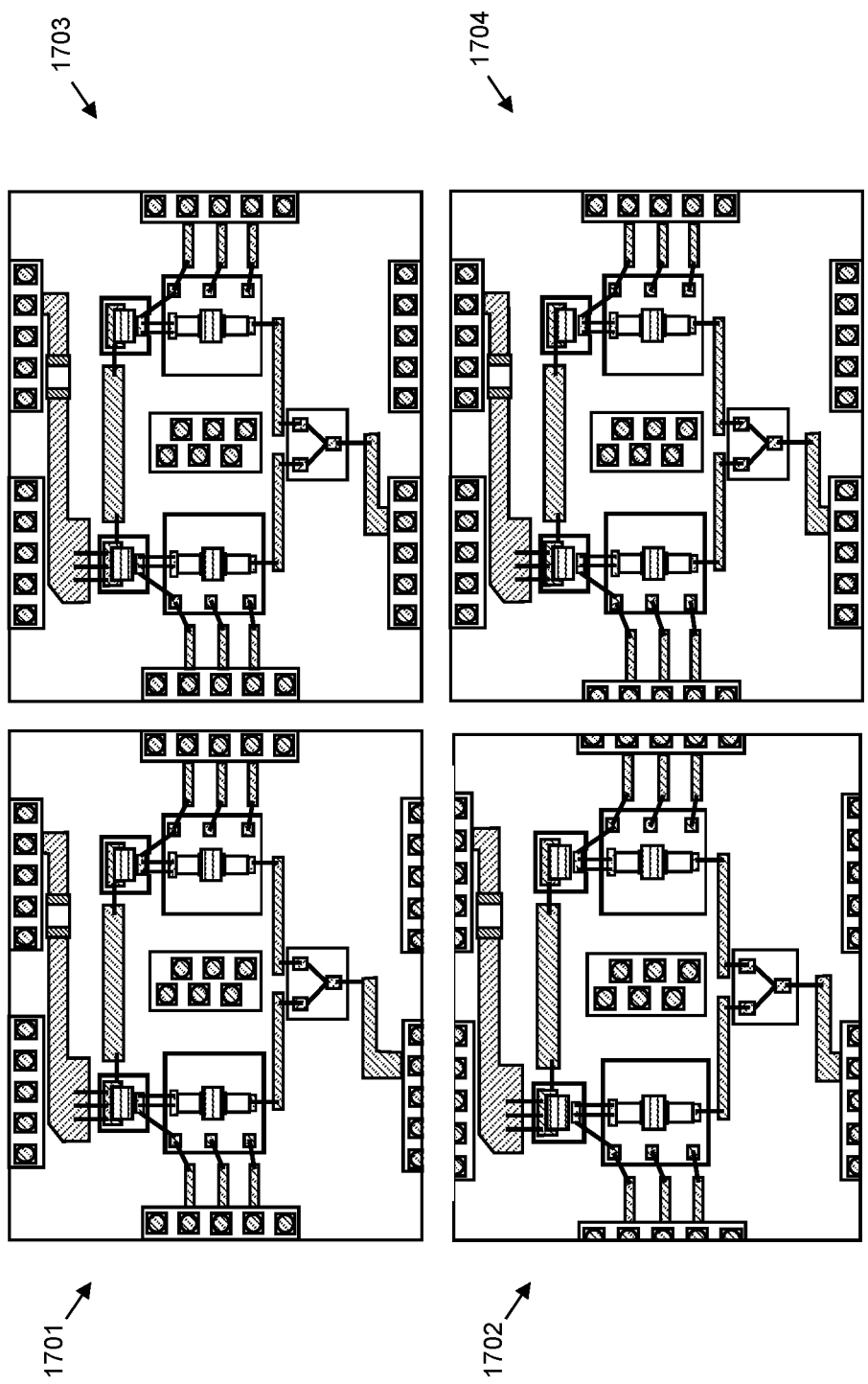
FIG. 17 is a top view of the panel of module substrates of FIG. 14B, 15C, or 16B after performing a singulation operation, in accordance with an example embodiment.

In a third embodiment, as depicted in step 1106" and illustrated in FIGS. 16A and 16B, a conductive attachment material drop process, followed by overmolding and encapsulant drilling processes are performed. Referring to FIG. 16A, which is another side, cross-sectional view of panel 1200 along line 14-14 (FIG. 13), conductive attachment material 383 (e.g., solder, solder paste or conductive adhesive) is applied to the exposed ends of the interposer terminals (e.g., terminals 212, 214, 248, 261, 262, 265, 266, 269), and an overmolding process is subsequently performed. The overmolding process includes applying viscous encapsulant material 380 onto the mounting surface 1209 so that the encapsulant material 380 entirely covers the mounting surface 1209, the components and dies, the interposers 1341, 1342, and the conductive attachment material 383, and extends some distance above the top surfaces of the interposers 1341, 1342 and the conductive attachment material 383. This results in a panel 1610 of encapsulated modules. After curing the encapsulant material 380, and referring to FIG. 16B, a plurality of openings 1620 are formed through the top surface 382 of the encapsulant material 380 to expose the conductive attachment material 383 (e.g., to expose the solder domes). For example, the openings may be formed using a laser ablation process (e.g., using a long pulse laser), using a mechanical drilling process, or using another suitable process.

Referring again to FIG. 11, after performing the overmolding process in one of steps 1106, 1106', or 1106", a singulation process is performed in step 1108 in order to separate each of the completed circuit modules 1201-1204 from the panel. For example, referring to FIG. 17, the panel may be mechanically, chemically, or laser cut along saw streets that correspond with the module edges (e.g., the dashed lines in FIG. 12). This results in a plurality of separate modules 1701, 1702, 1703, 1704, each of which is ready for attachment to a system substrate (e.g., system substrate 1010, FIG. 10). In addition, the singulation process ensures that first, second, third, and fourth sides of each module substrate are co-planar with first, second, third, and fourth sides of the encapsulant material 380 overlying each module substrate.

As mentioned previously, both single-row and double-row terminal interposers 1341, 1342 were attached to the modules 1201-1204. After sawing through each of the single-row interposers 1341, and as best seen by careful inspection of module 1702, the interposer 1341 has been divided into two interposer halves (e.g., 1341-1 and 1341-2), where one half 1341-1 is coupled to one module 1702 and exposed at a side surface of the module 1702, and the other half 1341-2 is coupled to the adjacent module 1704 and exposed at a side surface of the adjacent module 1704. In addition, the terminals of interposer 1341 also have been divided into two terminal halves (e.g., 1769-1 and 1769-2), so that each terminal half is exposed at a side surface of one of the modules 1702, 1704. In contrast, after sawing through each of the double-row interposers 1342, and as best seen by careful inspection of module 1703, the interposer 1342 has been divided into two interposer halves (e.g., 1342-1 and 1342-2), where one half 1342-1 is coupled to one module 1701, and the other half 1342-2 is coupled to the adjacent module 1703. In addition, each half of the interposer 1342-1, 1342-2 includes a row of intact (e.g., un-sawed) interposer terminals (e.g., 1769-3 and 1769-4) (i.e., the interposer terminals are not exposed at the sides of the modules 1701, 1703).

Referring again to FIG. 11, in step 1110, a module 200 (e.g., any one of modules 1701-1704) is prepared for attachment to a system substrate (e.g., system substrate 1010, FIG. 10). If conductive attachment material (e.g., material 383, such as solder, solder paste, or conductive adhesive) has not been pre-applied (e.g., in steps 1106, 1106'), then the conductive attachment material is applied during this step. For example, the conductive attachment material may be applied to either or both of the module terminals and/or corresponding pads (e.g., pads 1012, 1014, 1041, FIG. 10) on the mounting surface of the system substrate. The module 200 is then inverted, and the module terminals are aligned with and brought into contact with the corresponding pads on the mounting surface of the system substrate. The conductive attachment material (e.g., material 383) is then reflowed, cured, or otherwise processed to produce a mechanical and electrical connection (e.g., solder joints) between the module terminals and the system substrate pads. This establishes signal, ground, and bias voltage paths between the module 200 and the system substrate 1010.

Finally, in block 1112, a heat sink (e.g., heat sink 1016, FIG. 10) is attached to the heat sink attachment surface (e.g., surface 211, FIG. 3) of the module substrate 210. For example, the heat sink may be attached to the module substrate using a thermally conductive material (e.g., material 1098, such as thermal grease), clamps, screws, and/or other attachment means. The method then ends.

An embodiment of a circuit module includes a module substrate, a first thermal dissipation structure, a first semiconductor die, encapsulant material, and a first interposer. The module substrate has a mounting surface and a plurality of conductive pads at the mounting surface. The first thermal dissipation structure extends through the module substrate, and the first thermal dissipation structure has a first surface and a second surface, where the first surface of the first thermal dissipation structure is exposed at the mounting surface of the module substrate. The first semiconductor die is coupled to the first surface of the first thermal dissipation structure. The encapsulant material covers the mounting surface of the module substrate and the first semiconductor die, and a first surface of the encapsulant material defines a contact surface of the circuit module. A first interposer is embedded within the encapsulant material, and the first interposer includes a first conductive terminal with a proximal end coupled to a first conductive pad of the plurality of conductive pads, and a distal end exposed at the contact surface of the circuit module.

According to a further embodiment, the plurality of conductive pads is located at a first side of the module substrate, the first, second, third, and fourth sides of the module substrate are co-planar with first, second, third, and fourth sides of the encapsulant material, and the first interposer is exposed at the first side of the encapsulant material. According to another further embodiment, the first conductive terminal is not exposed at the first side of the encapsulant material. According to yet another further embodiment, the first conductive terminal is exposed at the first side of the encapsulant material.

According to yet another embodiment, the first interposer further includes a plurality of additional conductive terminals arranged to form a conductive wall between the first and second semiconductor dies. According to yet another embodiment, the first terminal includes a trench via that forms a conductive wall between the first and second semiconductor dies. According to yet another embodiment, the first interposer further includes a dielectric body, and the first conductive terminal comprises a conductive layer on a surface of the dielectric body.

An embodiment of an electronic system includes a system substrate and a circuit module. The system substrate has a first mounting surface and a conductive pad exposed at the first mounting surface. The circuit module has a contact surface and a heat sink attachment surface. The circuit module is coupled to the system substrate with the first mounting surface of the system substrate facing the contact surface of the circuit module. The circuit module further includes a module substrate, a thermal dissipation structure, a semiconductor die, encapsulant material, and an interposer. The module substrate has a second mounting surface and a plurality of conductive pads at the second mounting surface. The first thermal dissipation structure extends through the module substrate. The first thermal dissipation structure has a first surface and a second surface, where the first surface of the first thermal dissipation structure is exposed at the second mounting surface of the module substrate. The first semiconductor die is coupled to the first surface of the first thermal dissipation structure. The encapsulant material covers the second mounting surface and the first semiconductor die, and a first surface of the encapsulant material defines the contact surface of the circuit module. The first interposer is embedded within the encapsulant material. The first interposer includes a first conductive terminal with a proximal end coupled to a first conductive pad of the plurality of conductive pads, and a distal end exposed at the contact surface of the circuit module and electrically coupled to the first conductive pad of the system substrate.

An embodiment of a method of fabricating a circuit module includes coupling a semiconductor die to a thermal dissipation structure that extends through a module substrate. The module substrate has a first mounting surface, and a plurality of conductive pads at the first mounting surface, and a first surface of the thermal dissipation structure is exposed at the first mounting surface of the module substrate. The method further includes coupling an interposer to the module substrate. The interposer includes a first conductive terminal with a proximal end coupled to a first conductive pad of the plurality of conductive pads. The method further includes covering the mounting surface of the module substrate, the first semiconductor die, and the first interposer with encapsulant material, where a first surface of the encapsulant material defines a contact surface of the circuit module, and a distal end of the first conductive terminal is exposed at the contact surface.

According to a further embodiment, the method further includes coupling the circuit module to a system substrate with a second mounting surface of the system substrate facing the contact surface of the circuit module. According to a further embodiment, the circuit module has a heat sink attachment surface opposite the contact surface, and the method further includes coupling a heat sink to the heat sink attachment surface of the circuit module.

The preceding detailed description is merely illustrative in nature and is not intended to limit the embodiments of the subject matter or the application and uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, or detailed description.

The connecting lines shown in the various figures contained herein are intended to represent exemplary functional relationships and/or physical couplings between the various elements. It should be noted that many alternative or additional functional relationships or physical connections may be present in an embodiment of the subject matter. In addition, certain terminology may also be used herein for the purpose of reference only, and thus are not intended to be limiting, and the terms "first", "second" and other such numerical terms referring to structures do not imply a sequence or order unless clearly indicated by the context.

As used herein, a "node" means any internal or external reference point, connection point, junction, signal line, conductive element, or the like, at which a given signal, logic level, voltage, data pattern, current, or quantity is present. Furthermore, two or more nodes may be realized by one physical element (and two or more signals can be multiplexed, modulated, or otherwise distinguished even though received or output at a common node).

The foregoing description refers to elements or nodes or features being "connected" or "coupled" together. As used herein, unless expressly stated otherwise, "connected" means that one element is directly joined to (or directly communicates with) another element, and not necessarily mechanically. Likewise, unless expressly stated otherwise, "coupled" means that one element is directly or indirectly joined to (or directly or indirectly communicates with, electrically or otherwise) another element, and not necessarily mechanically. Thus, although the schematic shown in the figures depict one exemplary arrangement of elements, additional intervening elements, devices, features, or components may be present in an embodiment of the depicted subject matter.

While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application.

What is claimed is:

1. A circuit module comprising:
   a module substrate with a mounting surface and a plurality of conductive pads at the mounting surface;
   a first thermal dissipation structure extending through the module substrate, wherein the first thermal dissipation structure has a first surface and a second surface, wherein the first surface of the first thermal dissipation structure is exposed at the mounting surface of the module substrate;
   a first semiconductor die coupled to the first surface of the first thermal dissipation structure;
   encapsulant material covering the mounting surface of the module substrate and the first semiconductor die, wherein a first surface of the encapsulant material defines a contact surface of the circuit module; and
   a first interposer embedded within the encapsulant material, directly coupled to the mounting surface of the module substrate, wherein the first interposer includes a first conductive terminal with a proximal end coupled to a first conductive pad of the plurality of conductive pads, and a distal end exposed at the contact surface of the circuit module.

2. The circuit module of claim 1, wherein the first interposer further comprises:
   a dielectric body within which the first conductive terminal is embedded.

3. The circuit module of claim 2, wherein the first conductive terminal includes a conductive via extending through the dielectric body, a first conductive pad on a first surface of the dielectric body and in contact with the conductive via, and a second conductive pad on a second surface of the dielectric body and in contact with the conductive via.

4. The circuit module of claim 2, wherein the first interposer further comprises:
   at least one additional conductive terminal embedded in the dielectric body.

5. The circuit module of claim 1, further comprising:
   a second interposer embedded within the encapsulant material, wherein the second interposer includes a second conductive terminal with a proximal end coupled to a second conductive pad of the plurality of conductive pads, and a distal end exposed at the contact surface of the circuit module, and
   wherein the first interposer is exposed at the first side of the encapsulant material, and the second interposer is exposed at the second side of the encapsulant material.

6. The circuit module of claim 1, wherein the thermal dissipation structure includes a conductive structure selected from a metallic coin and a set of thermal vias.

7. The circuit module of claim 1, wherein a ground layer of the module substrate contacts the thermal dissipation structure.

8. A circuit module comprising:
   a module substrate with a mounting surface and a plurality of conductive pads at the mounting surface;
   a first thermal dissipation structure extending through the module substrate, wherein the first thermal dissipation structure has a first surface and a second surface, wherein the first surface of the first thermal dissipation structure is exposed at the mounting surface of the module substrate;
a first semiconductor die coupled to the first surface of the first thermal dissipation structure;
encapsulant material covering the mounting surface of the module substrate and the first semiconductor die, wherein a first surface of the encapsulant material defines a contact surface of the circuit module; and
a first interposer embedded within the encapsulant material, wherein the first interposer includes a first conductive terminal with a proximal end coupled to a first conductive pad of the plurality of conductive pads, and a distal end exposed at the contact surface of the circuit module,
wherein the plurality of conductive pads is located at the first side of the module substrate, first, second, third, and fourth sides of the module substrate are co-planar with first, second, third, and fourth sides of the encapsulant material, and the first interposer is exposed at the first side of the encapsulant material.

9. The circuit module of claim 8, wherein the first conductive terminal is not exposed at the first side of the encapsulant material.

10. The circuit module of claim 8, wherein the first conductive terminal is exposed at the first side of the encapsulant material.

11. A circuit module comprising:
a module substrate with a mounting surface and a plurality of conductive pads at the mounting surface;
a first thermal dissipation structure extending through the module substrate, wherein the first thermal dissipation structure has a first surface and a second surface, wherein the first surface of the first thermal dissipation structure is exposed at the mounting surface of the module substrate;
a first semiconductor die coupled to the first surface of the first thermal dissipation structure;
encapsulant material covering the mounting surface of the module substrate and the first semiconductor die, wherein a first surface of the encapsulant material defines a contact surface of the circuit module;
a first interposer embedded within the encapsulant material, wherein the first interposer includes a first conductive terminal with a proximal end coupled to a first conductive pad of the plurality of conductive pads, and a distal end exposed at the contact surface of the circuit module,
a second thermal dissipation structure extending through the module substrate, wherein the second thermal dissipation structure has a first surface and a second surface, wherein the first surface of the second thermal dissipation structure is exposed at the mounting surface of the module substrate; and
a second semiconductor die coupled to the first surface of the second thermal dissipation structure,
wherein the plurality of conductive pads is located between the first and second thermal dissipation structures.

12. The circuit module of claim 11, wherein the first interposer further comprises:
a plurality of additional conductive terminals arranged to form a conductive wall between the first and second semiconductor dies.

13. The circuit module of claim 11, wherein the first terminal comprises a trench via that forms a conductive wall between the first and second semiconductor dies.

14. The circuit module of claim 11, wherein:
the first interposer further comprises a dielectric body; and
the first conductive terminal comprises a conductive layer on a surface of the dielectric body.

15. An electronic system comprising:
a system substrate with a first mounting surface and a conductive pad exposed at the first mounting surface; and
a circuit module with a contact surface and a heat sink attachment surface, wherein the circuit module is coupled to the system substrate with the first mounting surface of the system substrate facing the contact surface of the circuit module, and wherein the circuit module further includes
a module substrate with a second mounting surface and a plurality of conductive pads at the second mounting surface,
a first thermal dissipation structure extending through the module substrate, wherein the first thermal dissipation structure has a first surface and a second surface, wherein the first surface of the first thermal dissipation structure is exposed at the second mounting surface of the module substrate,
a first semiconductor die coupled to the first surface of the first thermal dissipation structure,
encapsulant material covering the second mounting surface and the first semiconductor die, wherein a first surface of the encapsulant material defines the contact surface of the circuit module, and
a first interposer embedded within the encapsulant material, directly coupled to the second mounting surface of the module substrate, wherein the first interposer includes a first conductive terminal with a proximal end coupled to a first conductive pad of the plurality of conductive pads, and a distal end exposed at the contact surface of the circuit module and electrically coupled to the first conductive pad of the system substrate.

16. The system of claim 15, further comprising:
a heat sink coupled to the heat sink attachment surface.

17. A method of fabricating a circuit module, the method comprising:
coupling a semiconductor die to a thermal dissipation structure that extends through a module substrate, wherein
the module substrate has a first mounting surface, first, second, third, and fourth sides, and a plurality of conductive pads at the first mounting surface,
a first surface of the thermal dissipation structure is exposed at the first mounting surface of the module substrate;
directly coupling a first interposer to the module substrate, wherein the first interposer includes a first conductive terminal with a proximal end coupled to a first conductive pad of the plurality of conductive pads;
covering the mounting surface of the module substrate, the first semiconductor dies, and the first interposer with encapsulant material, wherein a first surface of the encapsulant material defines a contact surface of the circuit module, and a distal end of the first conductive terminal is exposed at the contact surface.

18. The method of claim 17, further comprising:
coupling the circuit module to a system substrate with a second mounting surface of the system substrate facing the contact surface of the circuit module.

19. The method of claim 18, wherein the circuit module has a heat sink attachment surface opposite the contact surface, and the method further comprises:
 coupling a heat sink to the heat sink attachment surface of the circuit module.

* * * * *